(12) United States Patent
Morikawa et al.

(10) Patent No.: US 6,829,080 B2
(45) Date of Patent: Dec. 7, 2004

(54) OPTICAL WAVEGUIDE DEVICE AND LIGHT SOURCE AND OPTICAL APPARATUS USING THE SAME

(75) Inventors: Akihiro Morikawa, Osaka (JP); Ken'ichi Kasazumi, Takatsuki (JP); Yasuo Kitaoka, Ibaraki (JP); Kiminori Mizuuchi, Neyagawa (JP); Kazuhisa Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 230 days.

(21) Appl. No.: 10/123,892

(22) Filed: Apr. 16, 2002

(65) Prior Publication Data

US 2002/0172488 A1 Nov. 21, 2002

(30) Foreign Application Priority Data

Apr. 17, 2001 (JP) ..................... 2001-118671
Jul. 11, 2001 (JP) ..................... 2001-210426
Aug. 1, 2001 (JP) ..................... 2001-233224

(51) Int. Cl.$^7$ .............................................. G02F 2/02
(52) U.S. Cl. .................. 359/332; 359/328; 385/122
(58) Field of Search ................... 385/122; 359/326–332

(56) References Cited

U.S. PATENT DOCUMENTS 5,313,543 A * 5/1994 Matsuda et al. ............ 359/328
5,481,636 A * 1/1996 Fukuda et al. .............. 359/332
5,610,760 A * 3/1997 Drenten et al. ............. 359/332
5,872,884 A * 2/1999 Mizuuchi et al. ........... 359/332
5,936,985 A * 8/1999 Yamamoto et al. ........... 372/31
6,317,546 B1  11/2001 Kasazumi et al.
6,519,077 B1 * 2/2003 Mizuuchi et al. ........... 359/332

FOREIGN PATENT DOCUMENTS

| JP | 4-276725 | 10/1992 | |
| JP | 5-323404 | 12/1993 | |
| JP | 6-118466 | 4/1994 | |
| JP | 09090448 A * | 4/1997 | ............. G02F/1/37 |
| JP | 2000-171653 | 6/2000 | |
| JP | 2000171653 A * | 6/2000 | ........... G02B/6/122 |

* cited by examiner

*Primary Examiner*—John D. Lee
*Assistant Examiner*—Scott A Knauss
(74) *Attorney, Agent, or Firm*—Merchant & Gould P.C.

(57) ABSTRACT

An optical waveguide device is provided that can reduce external interference noise. The optical waveguide device includes a substrate, an optical waveguide formed on the substrate, a periodic polarization inversion region formed on the optical waveguide, and an optical thin film formed in a portion of the optical waveguide. The optical waveguide (refractive index: N2) and the optical thin film (refractive index: N1) differ in refractive index dispersion, and the magnitude relationship between the refractive indexes is reversed depending on wavelength. The relationship N1>N2 is established for light having a shorter wavelength, while the relationship N2>N1 is established for light having a longer wavelength.

46 Claims, 16 Drawing Sheets

OPTICAL WAVEGUIDE DEVICE AND LIGHT SOURCE AND OPTICAL APPARATUS USING THE SAME

BACKGROUND OF THE INVENTION

1. Field of the Invention

The present invention relates to an optical waveguide device used, e.g., in the fields of optical information processing and optical application measurement and control, and to a light source and an optical apparatus using the same.

2. Description of the Related Art

Optical information recording/reproducing apparatuses can achieve higher density by using a shorter-wavelength light source. For example, a widespread compact disk (CD) apparatus uses near-infrared light having a wavelength of 780 nm, while a digital versatile disk (DVD) apparatus that can reproduce information with higher density uses a red semiconductor laser having a wavelength of 650 nm. To achieve a next-generation optical disk apparatus with even higher density, a blue laser source with even shorter wavelength has been under active development. For example, to provide a small and stable blue laser source, a second harmonic generation (hereinafter, referred to as "SHG") device has been developed by using a nonlinear optical material. For convenience, harmonic light that is produced by the SHG device also referred to as "SHG light" in the following.

FIG. 22 is a schematic view showing an example of an SHG blue light source including an SHG device.

First, the SHG blue light source will be described by referring to FIG. 22.

As shown in FIG. 22, a high refractive index region with a width of about 3 $\mu$m and a depth of about 2 $\mu$m is formed on an optical material substrate 114 by a proton-exchange method. This high refractive index region functions as an optical waveguide 110. Infrared light with a wavelength of 850 nm emitted from a semiconductor laser 111 is focused on the entrance end face of an SHG device 117 and propagates in the optical waveguide 110 on the SHG device 117 so as to be a fundamental guided wave. LiNbO$_3$ crystals, which are used as a substrate material for the optical material substrate 114, have a large nonlinear optical constant. Therefore, a harmonic guided wave having half the wavelength of the fundamental light (i.e., 425 nm) is excited from the electric field of the fundamental light. To compensate for a difference in propagation constant between the fundamental light and the harmonic light, a periodic polarization inversion region 112 is formed on the optical waveguide 110. The harmonic light that is excited over the entire region of the optical waveguide 110 is added coherently, which then exits from the exit end face of the optical waveguide 110.

It is necessary to maintain the wavelength of the fundamental light precisely constant to ensure accurate compensation for the difference in propagation constant between the fundamental light and the harmonic light. Therefore, a distributed Bragg reflection (hereinafter, referred to as "DBR") semiconductor laser is used as the semiconductor laser 111. The DBR semiconductor laser includes a DBR region and shows extremely small wavelength variations with respect to temperature or the like. In addition to such small wavelength variations, the DBR semiconductor laser also is characterized by high coherence and small noise because it oscillates with a single wavelength.

Next, the operation of an optical pickup system that includes the SHG blue light source using the SHG device will be described by referring to FIG. 22.

As shown in FIG. 22, harmonic blue light emitted from the SHG device 117 passes through a collimator lens 119, a polarizing beam splitter 120, a quarter-wave plate 121, and an objective lens 122 in sequence, and then is focused on an optical disk 124. The light modulated by the optical disk 124 is reflected from the polarizing beam splitter 120 and directed to a photodetector 125 through a focusing lens 123, thus providing a reproduction signal. At this time, linearly polarized light emitted from the SHG device 117 in the direction parallel to the sheet of the drawing is polarized in the direction perpendicular thereto by passing through and returning to the quarter-wave plate 121. All the reflected light from the optical disk 124 is reflected by the polarizing beam splitter 120 and does not return to the light source side.

In the aforementioned conventional technique, a configuration in which all the reflected light from the optical disk 124 is reflected by the polarizing beam splitter 120 and does not return to the light source side has been described. However, the base material for actual optical disks has a birefringent property. Thus, undesired polarized components generated in the optical disk 124 may pass through the polarizing beam splitter 120 and return to the light source side, as indicated by return light 126. During reproduction of the optical disk 124, the position of the objective lens 122 is controlled so as to ensure precise focusing on the optical disk 124. Therefore, the exit end face of the SHG device 117 and the optical disk 124 constitute a confocal optical system, and the reflected light from the optical disk 124 is focused precisely on the exit end face of the SHG device 117 (i.e., the exit end face of the optical waveguide 110).

As described above, the reflected light that returns from the optical disk to the light source side becomes return light to induce noise in the optical system using a semiconductor laser as the light source, and various techniques for avoiding this have been proposed. Examples of such techniques include a method for generating a plurality of longitudinal modes by modulating a semiconductor laser with a high frequency signal and a method for also generating a plurality of longitudinal modes by causing self-oscillation in a semiconductor laser. In the field of optical communication, an optical isolator that has a magneto-optical effect generally is located between a semiconductor laser and an optical fiber so that light from the semiconductor laser is focused on the optical fiber. Moreover, another method has been proposed that prevents reflected light from returning to a semiconductor laser by cutting the entrance end face of an optical fiber or an optical waveguide so as to reflect the reflected light that returns from the optical disk to the light source side obliquely (JP 5(1993)-323404 A or the like).

These techniques reduce noise caused by return light that returns to the inside of a semiconductor laser. As a result of experiments on reproduction of the optical pickup that includes the optical waveguide type SHG device shown in FIG. 22, the present inventors found noise caused by a different mechanism from that of the conventional noise induced by the return light. This noise is interference noise to be generated when the return light focused on the exit end face of the optical waveguide is reflected therefrom and interferes with light emitted from the optical waveguide. The output power of the light source appears to change due to this interference effect from the optical disk side, and a reproduction signal of the optical disk is modulated by low frequency noise, which leads to degradation of the reproduction signal. The noise induced by the return light in the semiconductor laser is generated by the interaction between light inside the semiconductor laser and the return light. On the other hand, the interference noise is generated by the interference between light emitted from the light source and the return light. More detailed studies conducted by the present inventors showed that a portion of the return light from an external optical system is excited again in the optical waveguide of the SHG device (the optical waveguide device) as a guided wave, then is reflected from the entrance end face of the optical waveguide, and also causes interference noise.

As described above, there are two different types of noise in the optical system that uses the optical waveguide device: low frequency interference noise and mode hopping noise. The low frequency interference noise occurs when light emitted from a light source is reflected and returns to the exit end of the light source to cause interference in the optical system outside the light source. The mode hopping noise results from the inside of the semiconductor laser. Various techniques have been proposed as a method for reducing the mode hopping noise. However, so far no consideration has been given to the interference noise outside a light source, and no solution to this problem has been proposed.

SUMMARY OF THE INVENTION

Therefore, with the foregoing in mind, it is an object of the present invention to provide an optical waveguide device that can reduce external interference noise, a light source and an optical apparatus using the optical waveguide device.

To achieve the above object, an optical waveguide device according to a configuration of the present invention includes a substrate, an optical waveguide formed in the vicinity of the surface of the substrate, and an optical thin film formed in at least a portion of the optical waveguide or formed in contact with at least a portion of the optical waveguide. A plurality of guided waves with different wavelengths propagate in the optical waveguide, a portion of the guided waves that exits from the optical waveguide returns to the optical waveguide again, and the optical thin film prevents reflection of light returning to the optical waveguide from the end faces of the optical waveguide or in the vicinity thereof.

In the configuration of the optical waveguide device of the present invention, it is preferable that fundamental light and harmonic light propagate in the optical waveguide, a harmonic light absorption region that includes the optical thin film and absorbs the harmonic light is provided in the vicinity of the entrance end face of the optical waveguide, and the fundamental light propagates in the harmonic light absorption region and a harmonic light non-absorption region that does not absorb the harmonic light in the optical waveguide, and waveguide mode sizes of the fundamental light in the two regions substantially match. According to this preferred example, when a light source is formed by combining with a semiconductor laser and this light source is used, e.g., in an optical pickup, interference noise caused by multiple reflection between an object to be observed, such as an optical disk, and a reflecting plane in the light source can be reduced, and wavelength conversion from the fundamental light into the harmonic light can be performed efficiently.

It is preferable that the effective refractive index of the harmonic light absorption region substantially matches that of the harmonic light non-absorption region. According to this preferred example, the waveguide mode sizes of the fundamental light propagating in the harmonic light absorption region and the harmonic light non-absorption region can be matched substantially.

It is preferable that the fundamental light propagates in both the harmonic light absorption region and the harmonic light non-absorption region with a zero-order transverse mode.

It is preferable that a harmonic light absorption film that acts as the optical thin film is formed on the optical waveguide in the harmonic light absorption region.

It is preferable that the optical waveguide in the harmonic light non-absorption region includes an optical waveguide layer and a high refractive index layer formed on the optical waveguide layer, in which the refractive index of the high refractive index layer is larger than that of the optical waveguide layer, and the optical waveguide in the harmonic light absorption region includes a second optical waveguide layer and a harmonic light absorption layer formed on the second optical waveguide layer, in which the harmonic light absorption layer includes a harmonic light absorption film as the optical thin film, and the refractive index of the harmonic light absorption film is larger than that of the second optical waveguide layer.

It is preferable that the optical waveguide in the harmonic light non-absorption region includes an optical waveguide layer, and the optical waveguide in the harmonic light absorption region includes a second optical waveguide layer and a harmonic light absorption layer formed on the second optical waveguide layer, in which the upper portion of the second optical waveguide layer is removed so as to have a smaller thickness than that of the optical waveguide layer, the harmonic light absorption layer includes a harmonic light absorption film as the optical thin film, and a refractive index of the harmonic light absorption film is larger than that of the second optical waveguide layer.

It is preferable that the optical waveguide in the harmonic light non-absorption region includes an optical waveguide layer, and the optical waveguide in the harmonic light absorption region includes a second optical waveguide layer and a harmonic light absorption layer formed on the second optical waveguide layer, in which the substantial thickness of the second optical waveguide layer is smaller than that of the optical waveguide layer, the harmonic light absorption layer includes a harmonic light absorption film as the optical thin film, and the refractive index of the harmonic light absorption film is larger than that of the second optical waveguide layer.

It is preferable that the optical thin film is formed by mixing and diffusing metal in the optical waveguide in the harmonic light absorption region. This preferred example can eliminate unevenness on the substrate surface caused by forming the harmonic light absorption film. Therefore, the configuration is suitable for precise face down mounting with the waveguide plane oriented toward the mounting substrate. In this case, iron can be used as the metal.

It is preferable that the fundamental light propagates in the harmonic light non-absorption region with a zero-order transverse mode and in the harmonic light absorption region with a higher-order transverse mode of not less than first order.

It is preferable that the optical waveguide in the harmonic light absorption region includes an optical waveguide layer and a harmonic light absorption layer formed on the optical waveguide layer, in which the harmonic light absorption layer includes a harmonic light absorption film as the optical thin film, and the refractive index of the harmonic light absorption film is larger than that of the optical waveguide layer.

It is preferable that the optical waveguide in the harmonic light absorption region includes an optical waveguide layer, a high refractive index layer formed on the optical waveguide layer, and a harmonic light absorption layer formed on the high refractive index layer, in which the refractive index of the high refractive index layer is larger than that of the optical waveguide layer, the harmonic light absorption layer includes a harmonic light absorption film as the optical thin film, and the refractive index of the harmonic light absorption film is larger than that of the high refractive index layer, and the optical waveguide in the harmonic light non-absorption region includes a second optical waveguide layer and a second high refractive index layer, in which the refractive index of the second high refractive index layer is larger than that of the second optical waveguide layer.

It is preferable that the optical waveguide in the harmonic light absorption region includes an optical waveguide layer, a harmonic light absorption layer formed on the optical waveguide layer, and a high refractive index layer formed on the harmonic light absorption layer, in which the harmonic light absorption layer includes a harmonic light absorption film as the optical thin film, the refractive index of the harmonic light absorption film is larger than that of the optical waveguide layer, and the refractive index of the high refractive index layer is larger than that of the optical waveguide layer, and the optical waveguide in the harmonic light non-absorption region includes a second optical waveguide layer and a second high refractive index layer, in which the refractive index of the second high refractive index layer is larger than that of the second optical waveguide layer.

It is preferable that the optical thin film is formed by mixing and diffusing metal in the optical waveguide in the harmonic light absorption region.

It is preferable that the waveguide mode size of the fundamental light propagating in the optical waveguide in the harmonic light absorption region changes continuously, and the waveguide mode sizes of the fundamental light at the entrance end and the exit end of the harmonic light absorption region substantially match the waveguide mode size of the fundamental light propagating in the optical waveguide in the harmonic light non-absorption region. According to this preferred example, the fundamental light can propagate efficiently, thus providing the harmonic light efficiently.

It is preferable that the optical waveguide in the harmonic light absorption region includes an optical waveguide layer and a harmonic light absorption layer formed on the optical waveguide layer, in which the harmonic light absorption layer includes a harmonic light absorption film as the optical thin film, and the substantial thickness of the harmonic light absorption film changes continuously in the harmonic light absorption region.

In the configuration of the optical waveguide device of the present invention, it is preferable that fundamental light and harmonic light propagate in the optical waveguide, and a harmonic light absorption film that absorbs the harmonic light and acts as the optical thin film is formed at the entrance end face of the optical waveguide. According to this preferred example, when a light source is formed by combining with a semiconductor laser and this light source is used, e.g., in an optical pickup, interference noise caused by multiple reflection between an object to be observed, such as an optical disk, and a reflecting plane in the light source can be reduced, and wavelength conversion from the fundamental light into the harmonic light can be performed with high efficiency.

It is preferable that the harmonic light absorption film is a semiconductor film or an oxide dielectric film. In this case, it is preferable that the semiconductor film is one selected from the group consisting of a Si film, a ZnSe film and GaP film, and the oxide dielectric film is a $TiO_x$ film. It is preferable that the TiOx film satisfies $1.7<x<1.9$.

In the configuration of the optical waveguide device of the present invention, it is preferable that the magnitude relationship between N1 and N2, i.e., which of N1 and N2 is greater, differs depending on a wavelength of the guided wave, where N1 is a refractive index of the optical thin film and N2 is a refractive index of the optical waveguide. This preferred example can separate light propagating in the optical waveguide depending on the wavelength. In particular, the influence of return light can be reduced effectively by a simple structure in which the optical thin film is formed in a portion of the optical waveguide. By using the optical thin film whose magnitude relationship in refractive index with the optical waveguide is reversed depending on wavelength, it is possible, in principle, to reduce the influence of the optical thin film upon the guided wave having one wavelength and to increase the influence of the optical thin film upon the guided wave having the other wavelength. In this manner, the guided waves propagating in the optical waveguide can be separated efficiently by wavelength.

It is preferable that the refractive indexes for at least one of the guided waves satisfy N1>N2, and the refractive indexes for the other guided wave satisfy N1<N2. In this case, it is preferable that fundamental light having a wavelength of $\lambda 1$ and harmonic light having a wavelength of $\lambda 2$ propagate in the optical waveguide, and the wavelengths satisfy $\lambda >\lambda 2$, the refractive indexes for the fundamental light having the wavelength $\lambda 1$ satisfy N1<N2, and the refractive indexes for the harmonic light having the wavelength $\lambda 2$ satisfy N1>N2. According to this preferred example, light having a short wavelength can be trapped within the optical thin film, while the light having a long wavelength can be propagated in the optical waveguide. Moreover, it is preferable that the optical thin film has an absorption coefficient of not less than 0.001 for the harmonic light. According to this preferred example, SHG light can be attenuated to 1/10 or less by the optical thin film of about several hundred micrometers length. It is preferable that a harmonic light absorption film for absorbing the harmonic light is further provided on at least one selected from the upper face, the lower face, and the inside of the optical thin film.

It is preferable that the optical thin film is formed of a multi-layer film. The refractive index dispersion of the optical thin film is inherent in its material. Therefore, it is difficult to adjust it precisely. However, this preferred example can control the dispersion characteristics of the film easily, so that the dispersion relationship between the optical waveguide and the optical thin film can be adjusted.

It is preferable that the optical thin film is formed on at least one selected from the surface, the lower face, and the side faces of the optical waveguide.

It is preferable that the optical thin film is formed in the vicinity of the entrance portion of the optical waveguide. This preferred example can improve the efficiency of the SHG device. That is, SHG light increases in proportion to the square of the distance between the entrance portion and the exit portion. By forming the optical thin film in the vicinity of the entrance portion, the influence upon the SHG light that increases with distance can be suppressed, thereby achieving high efficiency.

It is preferable that normal lines to the end portions of the optical thin film tilt with respect to the propagation direction of the guided wave at an angle greater than zero. This preferred example can reduce reflection from the end portion of the optical thin film significantly, thus preventing noise caused by return light.

It is preferable that a clad layer having a refractive index N3 is further provided on the surface of the optical waveguide, and the refractive indexes of the clad layer and the optical waveguide satisfy N3>N2. This preferred example can reinforce the confinement of the optical waveguide. Therefore, by applying this to the SHG device, the confinement of the optical waveguide can be reinforced to achieve high conversion efficiency.

It is preferable that an antireflection film is provided on the entrance en harmonic light. In this case, it is preferable that fundamental light and harmonic d face. This preferred example can further reduce a reflectance of the light propagate in the optical waveguide, and the antireflection film reduces a reflectance of the harmonic light to 1% or less.

A light source according to a first configuration of the present invention includes a semiconductor laser and an optical waveguide device. An optical waveguide device according to claim 1 is used as the optical waveguide device.

In the first configuration of the light source of the present invention, it is preferable that the semiconductor laser is a wavelength-variable semiconductor laser that has the function of varying wavelength with high coherence.

A light source according to a second configuration of the present invention includes a semiconductor laser having a wavelength of $\lambda 1$ and an optical waveguide device for converting light emitted from the semiconductor laser into light having a wavelength of $\lambda s$. An antireflection film for light having the wavelength of $\lambda s$ is provided at the exit end face of the semiconductor laser. This second configuration of the light source can reduce the influence of return light effectively. In principle, when light with the wavelength of $\lambda s$ emitted from the optical waveguide device is returned by reflection of some kind in the optical system, the antireflection film can prevent reflection of this $\lambda s$ wavelength light, i.e., return light. Thus, it is possible to prevent the return light from being reflected again and causing interference noise in the optical system.

In the second configuration of the light source of the present invention, it is preferable that an antireflection film for light having the wavelength of $\lambda s$ or an antireflection film for light having the wavelength of $\lambda 1$ and light having the wavelength of $\lambda s$ is provided on at least one selected from the entrance end face and the exit end face of the optical waveguide device.

In the second configuration of the light source of the present invention, it is preferable that the exit end face of the optical waveguide device tilts with respect to the propagation direction of a guided wave.

In the second configuration of the light source of the present invention, it is preferable that the vicinity of the exit end face of the semiconductor laser is made of a material that absorbs light having the wavelength of $\lambda s$.

In the second configuration of the light source of the present invention, it is preferable that the semiconductor laser has a grating structure.

In the second configuration of the light source of the present invention, it is preferable that the semiconductor laser and the optical waveguide device are coupled directly.

In the second configuration of the light source of the present invention, it is preferable that the antireflection film reduces a reflectance of light having the wavelength $\lambda s$ to 1% or less.

A light source according to a third configuration of the present invention includes a plurality of semiconductor lasers with different wavelengths and an optical waveguide device for converting light having wavelengths of $\lambda 1, \lambda 2, \lambda 3, \ldots, \lambda n$ emitted from the respective semiconductor lasers into light having wavelengths of $\lambda s1, \lambda s2, \lambda s3, \ldots, \lambda sn$. An antireflection film for the light having at least one wavelength selected from $\lambda s1, \lambda s2, \lambda s3, \ldots,$ and $\lambda sn$ is provided on the exit end face of at least one of the semiconductor lasers.

An optical apparatus according to a configuration of the present invention includes a light source and a focusing optical system for focusing light emitted from the light source on an object to be observed. A light source according to the present invention is used as the light source, and the optical waveguide device of the light source and the object to be observed are arranged so as to have a confocal relationship. According to this configuration, light can be focused on the object to be observed, such as an optical disk, by the optical system having a simple configuration. Moreover, since a light spot can be maintained stably in the range of depth of focus by the confocal optical system, a stable optical system can be provided. Further, focus detection or the like can be applied, thus stabilizing the optical system. It is also possible to reduce interference noise caused by multiple reflection between the object to be observed such as an optical disk and a reflecting plane in the light source. This configuration can prevent return light from an external optical system from being reflected by the entrance end face of the optical waveguide and also can reduce the generation of return light that is directed to the semiconductor laser.

In the configuration of the optical apparatus of the present invention, it is preferable that the object to be observed is an optical disk.

In the configuration of the optical apparatus of the present invention, it is preferable that the apparatus further includes an optical fiber, and light emitted from the light source enters the optical fiber.

DESCRIPTION OF THE PREFERRED EMBODIMENTS

Hereinafter, the present invention will be described more specifically by way of embodiments.
First Embodiment FIG. 1 is a schematic perspective view showing an optical apparatus according to a first embodiment of the present invention.

In this embodiment, an SHG device having the following configuration is used as an optical waveguide device, which is the component of the optical apparatus.

Figure 1:
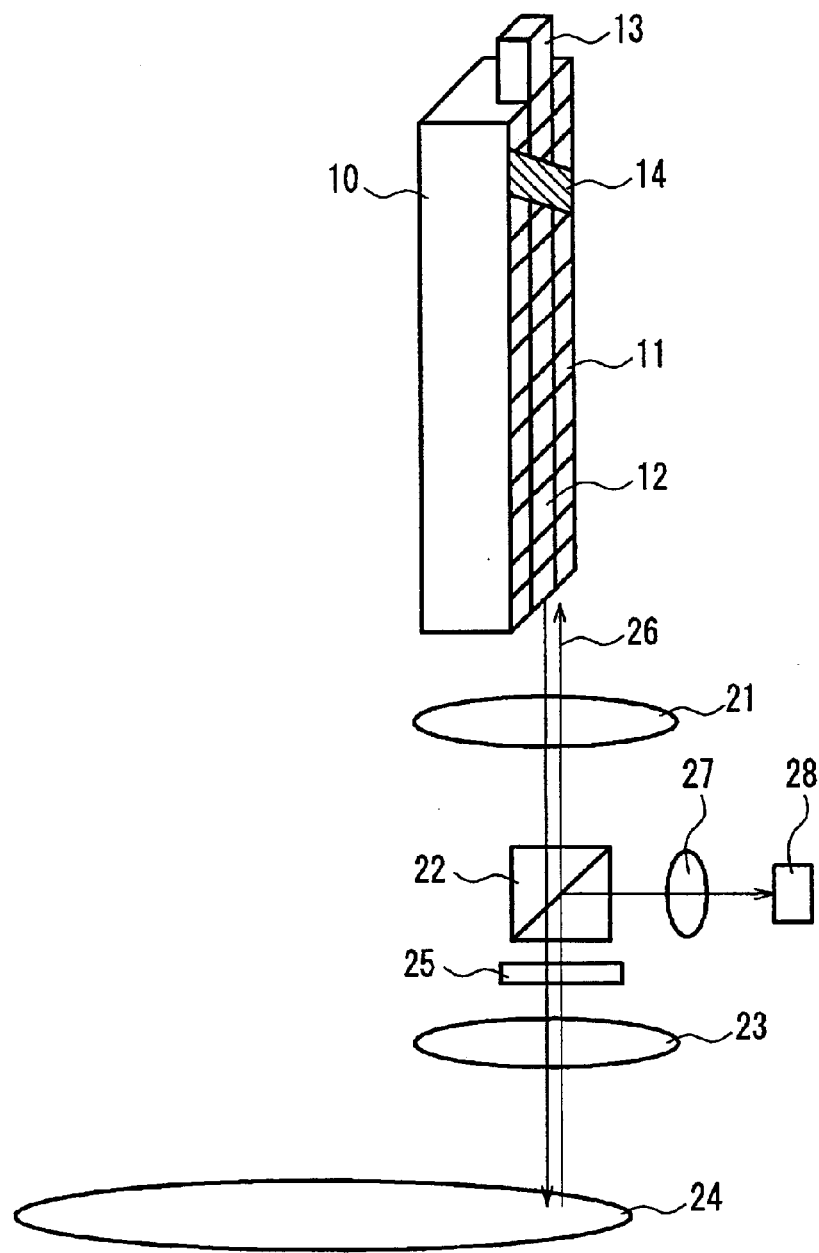
FIG. 1 is a schematic perspective view showing an optical apparatus according to a first embodiment of the present invention.

As shown in FIG. 1, a high refractive index region with a width of about 3 $\mu$m and a depth of about 2 $\mu$m is formed on an optical material substrate 10 of $LiNbO_3$ crystals by a proton-exchange method. This high refractive index region functions as an optical waveguide 12. Fundamental light (having a wavelength of 820 nm) emitted from a semiconductor laser 13 is focused on an entrance end face of the SHG device and propagates in the optical waveguide 12 on the SHG device so as to be a fundamental guided wave. The $LiNbO_3$ crystals, which are used as a substrate material for the optical material substrate 10, have a large nonlinear optical constant. Therefore, a harmonic guided wave having about half the wavelength of the fundamental light (i.e., 420 nm) is excited from the electric field of the fundamental light. To compensate for a difference in propagation constant between the fundamental light and the harmonic light, a periodic polarization inversion region 11 is formed on the optical waveguide 12. The harmonic light that is excited over the entire region of the optical waveguide 12 is added coherently, which then exits from the exit end face of the optical waveguide 12. It is desirable to maintain the wavelength of the fundamental light precisely constant to ensure accurate compensation for the difference in propagation constant between the fundamental light and the harmonic light. Therefore, a DBR semiconductor laser may be used as the semiconductor laser 13. The DBR semiconductor laser includes a DBR region and shows extremely small wavelength variations with respect to temperature or the like. Moreover, an optical thin film 14 for separating or absorbing light that returns to the optical waveguide 12 is formed thereon. As described above, a short-wavelength light source is made up of the semiconductor laser 13 and the SHG device having the above configuration.

Next, the operation of an optical pickup system that includes the short-wavelength light source using the SHG device will be described by referring to FIG. 1.

As shown in FIG. 1, the harmonic light emitted from the optical waveguide 12 passes through a collimator lens 21, a polarizing beam splitter 22, a quarter-wave plate 25, and an objective lens 23 in sequence, and then is focused on an optical disk 24. The optical disk 24 is an object to be observed. The collimator lens 21 is located in the center of distribution of light emitted from the optical waveguide 12. Therefore, the harmonic light that exits from the optical waveguide 12 is collimated substantially by the collimator lens 21. Here, the surface of the optical disk (the object to be observed) 24 and the exit end face of the SHG device (the optical waveguide device) constitute a confocal optical system. The harmonic light reflected from the optical disk 24 passes through the quarter-wave plate 25 with its polarization rotated, then is reflected from the polarizing beam splitter 22, and is directed to a photodetector 28 through a focusing lens 27, thus providing a reproduction signal. However, when polarization is not performed sufficiently by the quarter-wave plate 25 due to birefringence of the optical disk 24 or the like, a portion of the harmonic light may pass through the polarizing beam splitter 22 and return to the side of the SHG device, as indicated by return light 26. Cutting the exit end face of the SHG device obliquely with respect to the propagation direction of a guided wave can prevent reflection of the return light from the exit end face into the confocal optical system. Moreover, since the light returning to the optical waveguide 12 is separated or absorbed by the optical thin film 14, there is no component to interfere in the confocal optical system. Thus, the occurrence of interference noise in the confocal optical system can be suppressed completely. Further, there is no harmonic light component returning to the semiconductor laser 13, so that the stability of the semiconductor laser 13 also can be improved.

Figure 2:
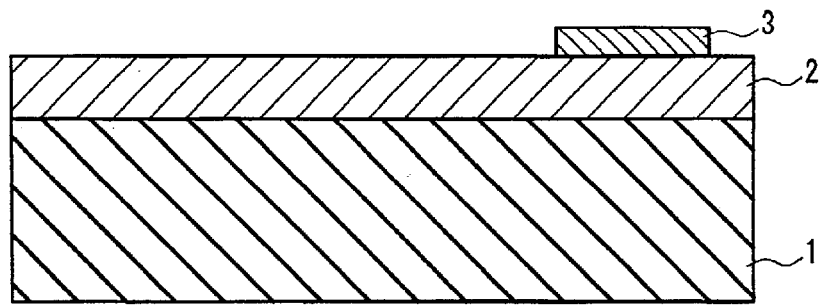
FIG. 2 is a schematic cross-sectional view showing an SHG device according to a first embodiment of the present invention.
Figure 3:
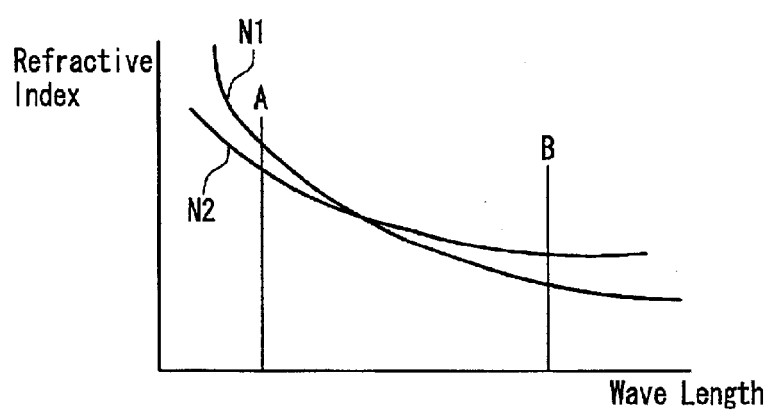
FIG. 3 shows the refractive index dispersion of an optical waveguide and an optical thin film according to a first embodiment of the present invention.
Figure 4:
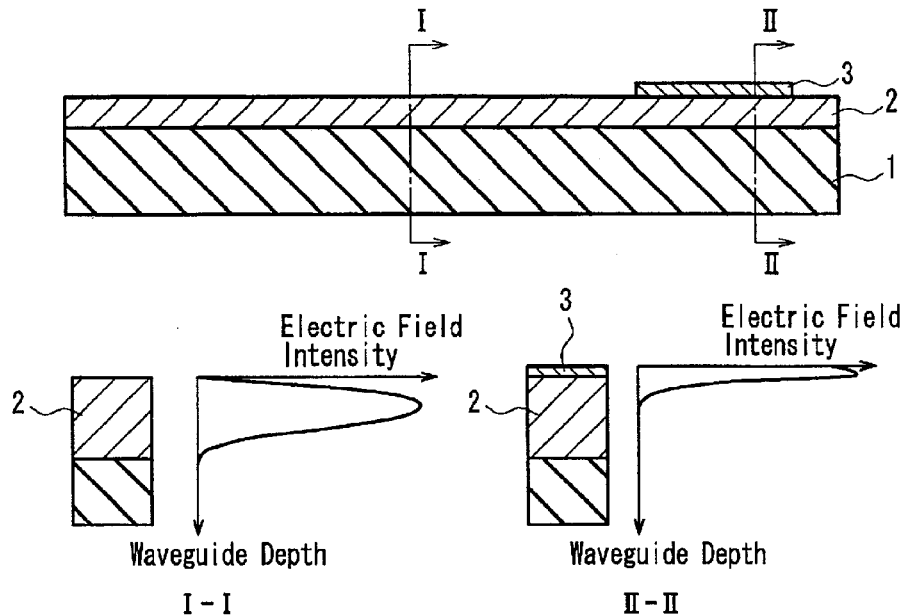
FIG. 4 shows the shape of a waveguide mode when light having a wavelength A (short wavelength) in FIG. 3 propagates in an optical waveguide.
Figure 5:
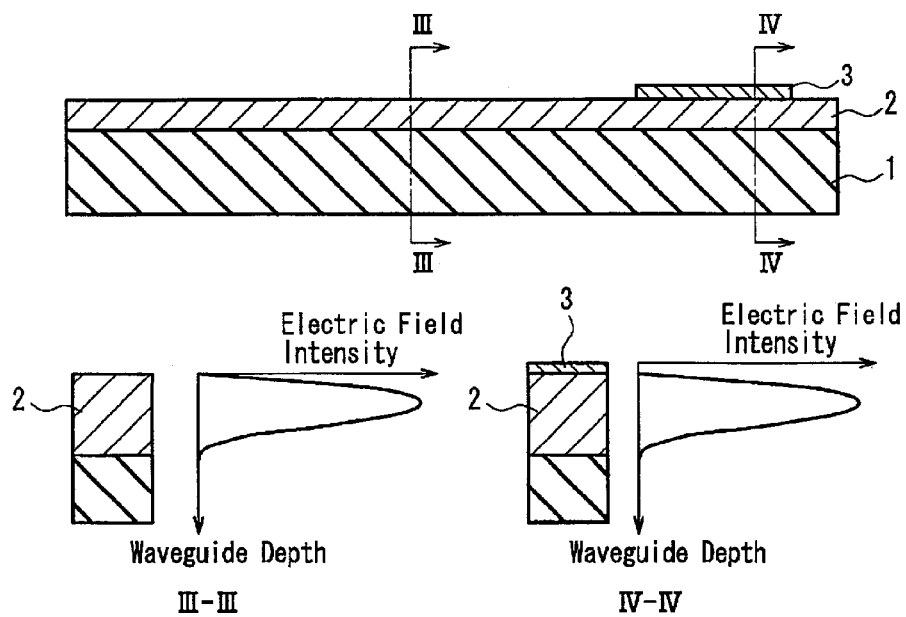
FIG. 5 shows the shape of a waveguide mode when light having a wavelength B (long wavelength) in FIG. 3 propagates in an optical waveguide.

Next, the detail of the SHG device will be described by referring to FIGS. 2 to 5. The SHG device acts as the optical waveguide device, which is the component of the optical apparatus of this embodiment. FIG. 2 is a schematic cross-sectional view showing the SHG device according to the first embodiment of the present invention. FIG. 3 shows the refractive index dispersion of the optical waveguide and the optical thin film. FIG. 4 shows the shape of a waveguide mode when light having a wavelength A (short wavelength) in FIG. 3 propagates in the optical waveguide. FIG. 5 shows the shape of a waveguide mode when light having a wavelength B (long wavelength) in FIG. 3 propagates in the optical waveguide.

As shown in FIG. 2, an optical waveguide 2 is formed on an optical material substrate 1, and an optical thin film 3 is formed on the optical waveguide 2. As shown in FIG. 3, the refractive index dispersion of the optical waveguide 2 (refractive index: N2) is different from that of the optical thin film 3 (refractive index: N1), and the magnitude relationship between the two refractive indexes is reversed depending on wavelength. In this embodiment, N1>N2 is satisfied for light having a wavelength (short wavelength) indicated by A in FIG. 3, while N2>N1 is satisfied for light having a wavelength (long wavelength) indicated by B in FIG. 3.

In FIG. 4, (I) illustrates the electric field distribution of the waveguide mode in the region where the optical thin film 3 is not formed, and (II) illustrates the electric field distribution of the waveguide mode in the region where the optical thin film 3 is formed. As shown in FIG. 4, the optical thin film 3 traps within itself the short-wavelength guided wave that has propagated in the optical waveguide 2. By utilizing this effect, the light having a wavelength A (short wavelength) traveling through the optical waveguide 2 can be separated from the optical waveguide 2 and trapped in the optical thin film 3.

Similarly, in FIG. 5, (III) illustrates the electric field distribution of the waveguide mode in the region where the optical thin film 3 is not formed, and (IV) illustrates the electric field distribution of the waveguide mode in the region where the optical thin film 3 is formed. As shown in FIG. 5, the light having the wavelength B (long wavelength) is hardly affected by the optical thin film 3.

As described above, by forming the optical thin film 3 on the optical waveguide 2, the light having the wavelength A (short wavelength) can be trapped within the optical thin film 3, while the light having the wavelength B (long wavelength) can be propagated in the optical waveguide 2. In other words, by utilizing a difference in dispersion characteristics between the optical thin film 3 and the optical waveguide 2, light propagating in the optical waveguide 2 can be separated depending on the wavelength.

In this embodiment, the refractive index of the optical thin film 3 is larger than that of the optical waveguide 2 in the short-wavelength region. However, there is no problem even if the magnitude relationship between the two refractive indexes is reversed. In such a case, the long-wavelength light is absorbed or dispersed by the optical thin film 3.

The optical thin film also can be used as a film that has an influence upon the guided wave. When the optical thin film is provided in the form of a grating, it can have the effect of diffracting the guided wave. Moreover, the diffraction efficiency of the optical thin film can be adjusted because the refractive index thereof differs depending on wavelength.

The waveguide mode differs greatly depending on the wavelength in the portion of the optical waveguide that includes the optical thin film 3 and in the other portion, resulting in mode coupling loss. To reduce this loss, the scattering loss should be decreased in the following manner: the optical thin film is tapered so that the thickness changes gradually, and thus the guided wave is introduced gradually into the optical thin film. It is also possible to guide light having different wavelengths to different locations by forming the portion of the optical thin film as a three-dimensional optical waveguide.

In the SHG device of this embodiment, the guided waves having two wavelengths are separated. However, it is also possible to separate the light having a specific wavelength from light having three or more wavelengths that propagates in the optical waveguide.

A film having a multi-layer structure can be used as the optical thin film. The multi-layer optical thin film can control its dispersion characteristics easily, so that the relationship in dispersion between the optical waveguide 2 and the optical thin film can be adjusted. To absorb the light having a specific wavelength that is separated from the light having two or more wavelengths that propagates in the optical waveguide by the optical thin film, a film having a large absorption coefficient for the separated light should be included in the multi-layer optical thin film, thereby making the absorption easy.

Second Embodiment

This embodiment describes a means for preventing return light of harmonic light in an optical waveguide device. As described above, when an optical apparatus includes the optical waveguide device, the end faces (i.e., the entrance end face and the exit end face) of the optical waveguide and a focusing point constitute a confocal optical system, and return light reflected from the entrance end face or the exit end face causes interference noise. For the exit end face of the optical waveguide, the interference noise can be reduced, e.g., by cutting the exit end face obliquely with respect to the propagation direction of a guided wave so as to prevent light being reflected from the exit end face into the confocal optical system. However, it is difficult to reduce the interference noise caused by reflection from the entrance end face of the optical waveguide. This is because, assuming that the semiconductor laser 13 and the optical waveguide 12 are coupled directly as shown in FIG. 1, when the entrance end face of the optical waveguide 12 tilts with respect to the propagation direction, the efficiency of coupling with the semiconductor laser 13 is lowered.

Figure 6:
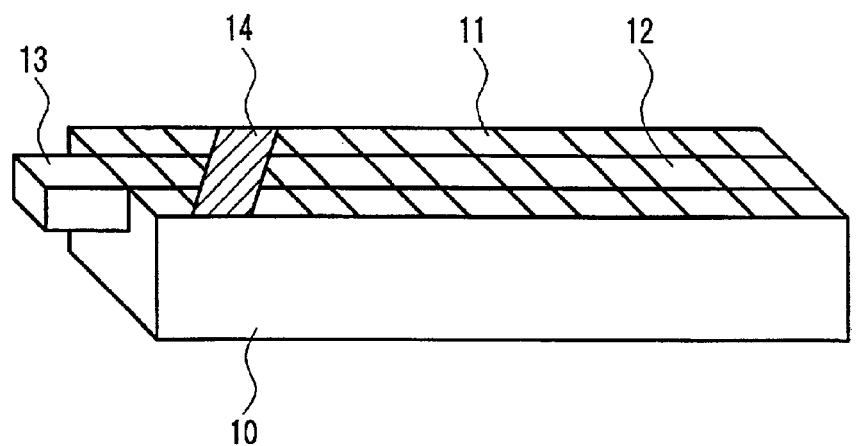
FIG. 6 is a schematic perspective view showing an SHG device provided with an optical thin film according to a second embodiment of the present invention.

To reduce reflected light from the entrance end face of the optical waveguide, the configuration of the present invention that includes an optical thin film is effective. FIG. 6 shows the configuration of an optical waveguide device (SHG device) provided with the optical thin film. As shown in FIG. 6, this optical waveguide device includes an optical waveguide 12 and a periodic polarization inversion region 11 that are formed on an MgO-doped LiNbO$_3$ substrate 10. A semiconductor laser 13 is coupled directly to the entrance end face of the optical waveguide 12. Fundamental light emitted from the semiconductor laser 13 is converted into harmonic light by the periodic polarization inversion region 11 in the optical waveguide 12, and then exits from the other end (the exit end face) of the optical waveguide 12. When second harmonic light is used, the wavelength of the harmonic light is $\lambda/2$ compared with the wavelength $\lambda$ of the fundamental light. For example, when an infrared semiconductor laser having a wavelength of about 800 nm is used, purple SHG light having a wavelength of 400 nm can be obtained. An optical thin film 14 is formed in the vicinity of the entrance end face of the optical waveguide 12. The harmonic light that is reflected by the optical system and returns to the optical waveguide 12 is dispersed or absorbed by the optical thin film 14, so that it does not reach the entrance end face of the optical waveguide 12. This can prevent the interference noise caused by the return light reflected from the entrance end face of the optical waveguide 12. Therefore, even if the optical apparatus includes the confocal optical system, it is possible to detect a signal light with low noise. However, when the optical thin film is not provided, the interference noise occurs to increase a noise component of the signal light significantly.

The optical waveguide 12 is formed by performing a proton exchange on the MgO-doped $LiNbO_3$ substrate 10 in pyrophosphoric acid. A mixed film of $Nb_2O_5$ and $WO_3$ is used as the optical thin film 14 to control the relationship in refractive index dispersion between the optical waveguide 12 and the optical thin film 14. As shown in FIG. 3, the refractive index (N1) of the optical thin film 14 is larger than the refractive index (N2) of the proton-exchange optical waveguide 12 for light having a wavelength of 400 nm (wavelength A), and the refractive index (N1) is smaller than the refractive index (N2) for light having a wavelength of 800 nm (wavelength B). The waveguide mode of 800 nm-band fundamental light is the same as that shown in FIG. 5, and thus the optical thin film 14 hardly affects the waveguide mode. Therefore, the fundamental light is unaffected by dispersion or absorption loss of the optical thin film 14 and can propagate in the optical waveguide 12 while maintaining low propagation loss. On the other hand, the optical thin film 14 has a higher refractive index than that of the optical waveguide 12 for 400 nm-band SHG light. Therefore, the propagation state of the guided wave differs greatly between the portion of the optical waveguide that includes the optical thin film 14 and the other portion, as shown in FIG. 4. In the portion of the optical waveguide that includes the optical thin film 14, the SHG light propagates in the optical thin film portion. Thus, the SHG light reaching the end face of the optical waveguide 12 is attenuated, so that the return light of the SHG light is reduced significantly.

To achieve a further reduction in the return light of the SHG light, absorption by the film is effective. As shown in FIG. 4, the SHG light is drawn into the optical thin film 14. When the optical thin film 14 has a large absorption coefficient for the SHG light, it absorbs the SHG light with high efficiency. Therefore, even if a manufacturing error of the optical waveguide 12 is large, the return light is attenuated. For example, when the optical thin film 14 has an absorption coefficient of at least 0.001 for the SHG light, the SHG light can be attenuated to $\frac{1}{10}$ or less by the optical thin film 14 of several hundred micrometers length. When the absorption coefficient of the optical thin film itself is small, a film having a large absorption coefficient is deposited on at least one of the upper and lower faces of the optical thin film, thereby increasing the absorption coefficient of the entire film. For example, a Si film is very effective because it can increase the absorption coefficient by many times. The optical thin film that has the multi-layer structure or the like also provides the following effects: the film structure can be changed and the electric field distribution of the SHG light is drawn to the surface, thus increasing the absorption of light by the absorption film.

As shown in FIG. 4, the shape of a mode can be changed greatly by forming the optical thin film 14. This indicates that the effective refractive index of the optical waveguide 12 is changed largely by the presence or absence of the optical thin film 14, and such a difference in refractive index causes Fresnel reflection. Specifically, the SHG light returning to the optical waveguide 12 is reflected in the vicinity of the optical thin film 14, which is responsible for noise by the return light. To prevent this noise, the optical waveguide device (the SHG device) shown in FIG. 6 is formed so that the normal lines to the end portions of the optical thin film 14 tilt with respect to the propagation direction of a guided wave (i.e., the longitudinal direction of the optical waveguide 12). This configuration can reduce the reflection of the guided wave in the propagation direction (the longitudinal direction of the optical guide wave 12) significantly at this portion.

In this embodiment, the mixed film of $Nb_2O_5$ and $WO_3$ is used to control the relationship in refractive index dispersion between the optical waveguide 12 and the optical thin film 14. However, a multi-layer film including these materials also can provide the same effect. A mixed film or multi-layer film of $WO_3$, $CrO_3$ and $TiO_2$ can provide the same effect as well. The film made of an oxide is desirable because it has a small absorption coefficient and thus little effect on the propagation loss of the optical waveguide 12. The film is effective particularly in the short-wavelength region near 400 nm.

This embodiment utilizes a difference in the wavelength dispersion characteristics of refractive indexes between the optical waveguide and the optical thin film. In general, the wavelength dispersion of refractive indexes of materials changes gradually, and some degree of wavelength difference is required to reverse the magnitude of the refractive indexes between the materials and to increase the difference in refractive index. When the wavelength difference is about several tens of nanometers, it is difficult to increase the difference in refractive index. Therefore, it is desirable that the wavelength difference should be not less than 100 nm, and a difference in absolute value of the wavelengths should be not less than 20%. In view of this, the second harmonic light and the third harmonic light have the advantage of increasing the difference in refractive index because they differ greatly from the fundamental light in wavelength and in absolute value of the wavelength (the absolute values of the wavelengths of the second and third harmonic light are two times and three times that of the fundamental light, respectively).

In the vicinity of absorption edge of the materials, the wavelength dispersion characteristics of the refractive indexes change largely to the extent that the magnitude of the refractive indexes is reversed. Therefore, it is desirable to use a material whose transmission cutoff corresponds substantially to the wavelength region of the harmonic light as the optical thin film. In particular, since the absorption edge of the material is in the short-wavelength region, the material whose transmission cutoff corresponds substantially to the wavelength region of the harmonic light is effective in separating ultraviolet light and infrared light from blue light having a wavelength of 450 nm or less.

Figure 7:
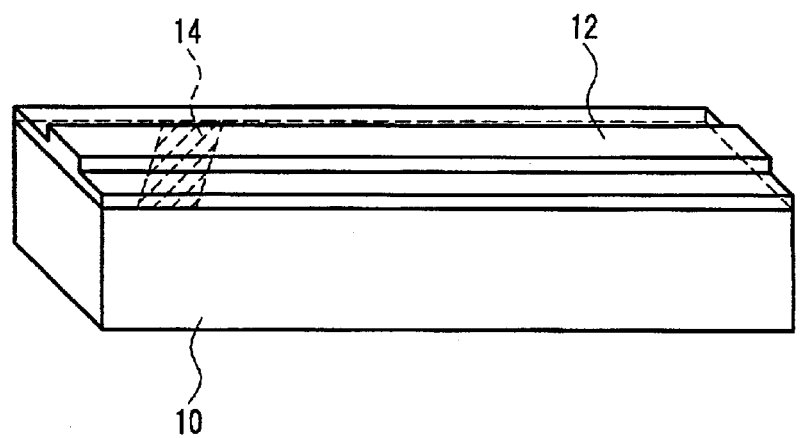
FIG. 7 is a schematic perspective view showing another example of an SHG device provided with an optical thin film according to a second embodiment of the present invention.

In this embodiment, the optical thin film 14 is formed on the surface of the optical waveguide 12. However, the same effect also can be obtained by forming the optical thin film on the lower face or the side faces of the optical waveguide. For example, as shown in FIG. 7, the optical waveguide 12, which is produced by processing a thin film crystal so as to have a ridged surface, is formed on the substrate 10. In this case, the optical thin film 14 may be formed on a part of the lower face or the side faces of the optical waveguide 12. This configuration can provide the same effect as that obtained by forming the optical thin film 14 on the surface of the optical waveguide 12. In this ridge structure, the width and thickness of the optical waveguide 12 are set to be several micrometers so that the optical waveguide 12 achieves single mode propagation. Example of materials for the optical waveguide 12 include crystals such as KTP, $LiNbO_3$, and $LiTaO_3$ or crystals such as $LiNbO_3$ and $LiTaO_3$ that are doped with Mg, Zn, In, Sc or the like. These materials have excellent resistance to damage and thus enable high output characteristics.

In this embodiment, the optical thin film 14 is used only to separate the harmonic light components. However, it can be applied to the optical system that utilizes separated light. For example, when a plurality of light beams with different wavelengths propagate in an optical waveguide, the optical thin film can be used in a wavelength separation optical system that separates the light beams according to their respective wavelengths. Also, a plurality of optical thin films with different wavelength dispersion can be formed to separate light into other optical waveguides. In this case, however, the waveguide mode changes sharply at the end portions of the optical thin films. Therefore, it is desirable to prevent the occurrence of dispersion due to mismatches in the waveguide mode. For example, the optical thin film may be tapered so that the thickness changes gradually at its end portions, thereby reducing dispersion loss.

The configuration of the present invention also can be applied to an optical waveguide that includes a high refractive index clad layer. This structure reinforces the confinement of the optical waveguide in such a manner that a layer having a higher refractive index than that of the optical waveguide is deposited on the optical waveguide. An SHG device having this structure can reinforce the confinement of the optical waveguide and achieve wavelength conversion with high efficiency. Moreover, when the optical thin film is formed on the surface or the lower face of this optical waveguide, the same effect as that described above can be obtained. For the optical waveguide that includes particularly the high refractive index clad layer, it is effective to form the optical thin film on the lower face of the optical waveguide. In the SHG device including the high refractive index clad layer, fundamental light propagates in the optical waveguide with a fundamental mode, while harmonic light propagates with a higher-order mode. When the optical thin film is formed on the high refractive index clad layer, it has a great effect on a mode change in the fundamental light with respect to the fundamental mode and little effect on a mode change in the harmonic light with respect to the higher-order mode. To separate the harmonic light component by the optical thin film, the optical thin film should be formed on the lower face of the optical waveguide, thus enabling efficient separation of the component.

In the optical waveguide device shown in FIG. 6, an antireflection film (not shown) for two wavelengths of the harmonic light and the fundamental light is provided at the entrance end face. A conventional SHG device generally has an antireflection film for the fundamental light at its entrance end face so as to prevent the fundamental light from returning to the semiconductor laser. When the antireflection film for the harmonic light that returns from the optical system side is formed at the entrance end face of the SHG device, the reflectance with respect to the harmonic light can be reduced further, even if the return light is not eliminated completely by absorption of the optical thin film. In this case, it is desirable to provide the antireflection film that can reduce the reflectance with respect to the harmonic light to 1% or less. To achieve the antireflection film characteristics for light with two wavelengths, a multi-layer film is necessary. In designing the film, at least two materials with different refractive indexes should be used. Examples of the materials include $SiO_2$, $TiO_2$, $Ta_2O_5$, $Nb_2O_5$, $HfO_2$, $CeO_2$, and $Si_3N_4$. The antireflection film for two wavelengths of the harmonic light and the fundamental light makes it possible to couple the fundamental light efficiently to the optical waveguide. Moreover, the antireflection film is an effective means also for reducing noise caused by the return light to the semiconductor laser.

As described above, the optical thin film having a multi-layer structure that includes a film with harmonic light absorption property (i.e., a harmonic light absorption means) can attenuate the harmonic light efficiently. When the film with harmonic light absorption property is further deposited on at least one of the upper and lower faces of the multi-layer optical thin film, the attenuation of the harmonic light can be more efficient. In the case where near-infrared light having a wavelength of 820 nm is used as the fundamental light and blue light having a wavelength of 410 nm is used as the harmonic light, the film with harmonic light absorption property can be made of materials, such as titanium oxide, Si, barium oxide, zinc selenide, and gallium phosphide. These materials are transparent to light in the infrared region, have the spectral characteristics that absorb blue light, and can be formed as a thin film on the optical waveguide by sputtering or the like. For a device that uses light beams whose wavelengths differ from those of the above example, e.g., red light is used as the fundamental light and ultraviolet light is used as the harmonic light, other materials are used for the harmonic light absorption means.

In the first and second embodiments, the SHG device is used as the optical waveguide device. However, the optical waveguide device is not limited particularly thereto. For example, devices with various functions and configurations can be used, such as a high-speed modulation device, a phase shifter, a frequency shifter, and a polarization control device. The optical waveguide device of the present invention can be applied to all the above optical waveguide devices and the optical systems that use a coherent light source including the optical waveguide device. A light source that includes the SHG device often uses a high-coherence DBR semiconductor laser as the semiconductor laser to generate high-coherence harmonic light, which in turn causes interference noise easily. However, when the light source is combined with the optical waveguide device of this embodiment, the interference noise can be reduced most effectively.

Third Embodiment

Figure 8:
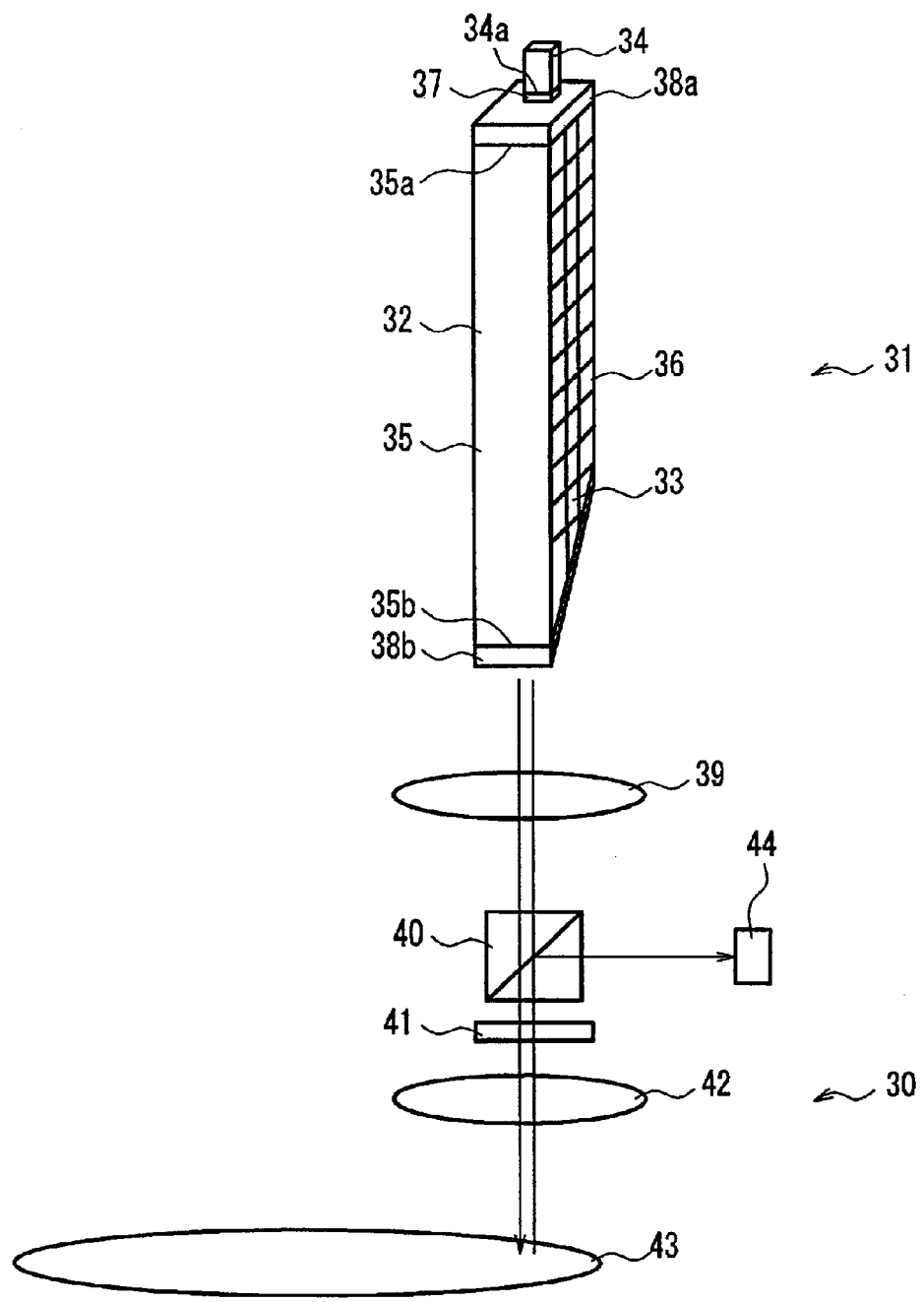
FIG. 8 is a schematic perspective view showing an optical apparatus according to a third embodiment of the present invention.
Figure 9:
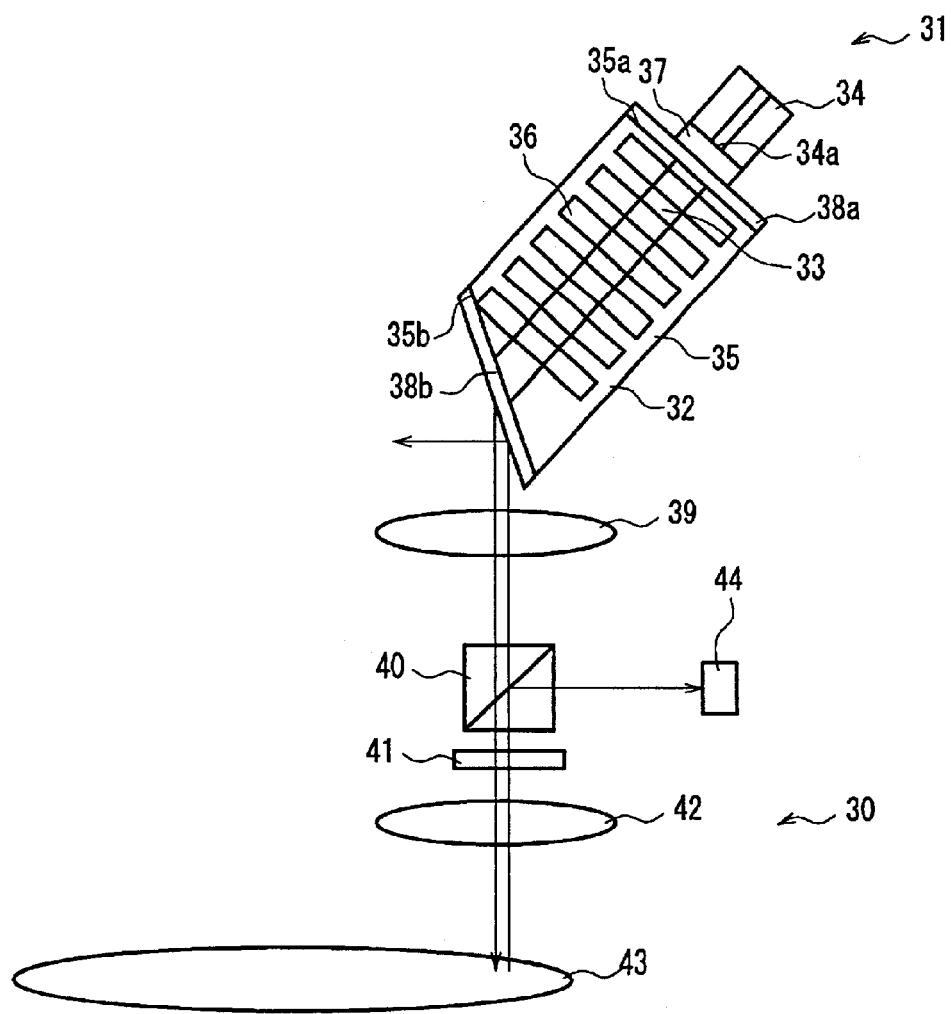
FIG. 9 is a plan view of FIG. 8.
Figure 10:
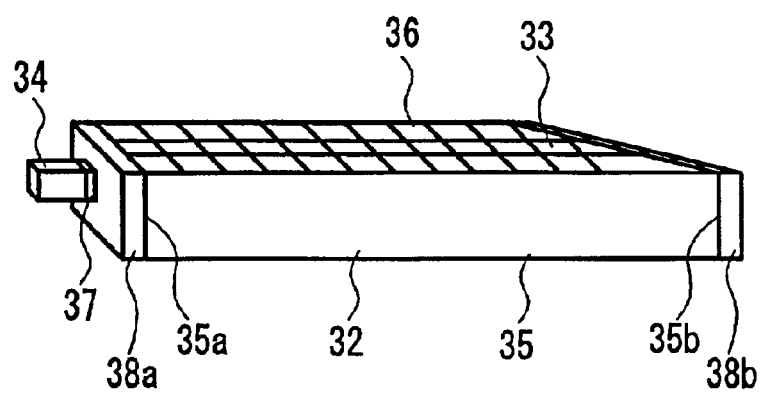
FIG. 10 is a schematic perspective view showing a coherent light source according to a third embodiment of the present invention.

FIG. 8 is a schematic perspective view showing an optical apparatus according to a third embodiment of the present invention, FIG. 9 is a plan view of the optical apparatus, and FIG. 10 is a schematic perspective view showing a coherent light source according to the third embodiment.

In this embodiment, an SHG device 35 having the following configuration is used as an optical waveguide device, which is the component of an optical apparatus 30.

As shown in FIGS. 8 to 10, a high refractive index region with a width of about 3 μm and a depth of about 2 μm is formed on an optical material substrate 32 of $LiNbO_3$ crystals by a proton-exchange method. This high refractive index region functions as an optical waveguide 33. Fundamental light (having a wavelength of 820 nm) emitted from a semiconductor laser 34 is focused on an entrance end face 35a of the SHG device 35 and propagates in the optical waveguide 33 on the SHG device 35 so as to be a fundamental guided wave. The $LiNbO_3$ crystals, which are used as a substrate material for the optical material substrate 32, have a large nonlinear optical constant. Therefore, a harmonic guided wave having half the wavelength of the fundamental light (i.e., 410 nm) is excited from the electric field of the fundamental light. To compensate for a difference in propagation constant between the fundamental light and the harmonic light, a periodic polarization inversion region 36 is formed on the optical waveguide 33. The harmonic light that is excited over the entire region of the optical waveguide 33 is added coherently, which then exits from the exit end face of the optical waveguide 33. It is desirable to maintain the wavelength of the fundamental light precisely constant to ensure accurate compensation for the difference in propagation constant between the fundamental light and the harmonic light. Therefore, a DBR semiconductor laser is used as the semiconductor laser 34. The DBR semiconductor laser includes a DBR region and shows extremely small wavelength variations with respect to temperature or the like. Here, the semiconductor laser 34 and the SHG device 35 are coupled directly.

An antireflection film 37 for the harmonic light (having a wavelength of 410 nm), which is obtained by wavelength conversion with the SHG device 35, is formed at the exit end face 34a of the semiconductor laser 34. The antireflection film 37 is a multi-layer film including materials with high refractive index and low refractive index. Therefore, the antireflection film 37 can prevent reflection of the harmonic light that returns to the optical waveguide 33 and control the reflectance for the fundamental light so as to increase the oscillation efficiency of the semiconductor laser 34. The reflectance of the antireflection film 37 with respect to the harmonic light is set to 1% or less. Examples of the high refractive index material include Si, $Ta_2O_5$, $Nb_2O_5$, $TiO_2$, $HfO_2$, $ZrO_2$ and ZnO. Examples of the low refractive index material include $SiO_2$, MgO, and $Al_2O_3$.

The exit end face 35b of the SHG device 35 is cut obliquely with respect to the propagation direction of a guided wave. Thus, light exits obliquely with respect to the propagation direction from the SHG device 35. The entrance end face 35a and the exit end face 35b of the SHG device 35 are provided with antireflection films 38a, 38b for both the fundamental light and the harmonic light, respectively. Each of the antireflection films is a multi-layer film. It is desirable that the antireflection film 38a is made of a material having a small absorptance for the fundamental light, and that the antireflection film 38b is made of a material having a small absorptance for the harmonic light. For example, $TiO_2$, $Nb_2O_5$, $SiO_2$ and $Ta_2O_5$ can be used in a single layer form or multi-layer form.

As described above, the coherent light source 31 is made up of the semiconductor laser 34 and the SHG device 35 having the above configuration.

Next, the operation of an optical apparatus (optical pickup system) 30 that includes the coherent light source 31 will be described by referring to FIGS. 8 and 9.

As shown in FIGS. 8 and 9, light emitted from the semiconductor laser 34 passes through the SHG device 35, a collimator lens 39 that acts as a collimator optical system, a polarizing beam splitter 40, a quarter-wave plate 41, and an objective lens 42 in sequence, and then is focused on an optical disk 43. The optical disk 43 is an object to be observed. The collimator lens 39 is located in the center of distribution of light emitted from the optical waveguide 33. Therefore, the harmonic light that exits obliquely with respect to the propagation direction from the optical waveguide 33 is collimated substantially by the collimator lens 39. Here, the surface of the optical disk (the object to be observed) 43 and the exit end face 35b of the SHG device (the optical waveguide device) 35 constitute a confocal optical system.

When the fundamental light having a wavelength of λ1 (hereinafter, referred to as "λ1 fundamental light") is emitted from the semiconductor laser 34 and enters the SHG device 35, the entrance end face 35a of the SHG device 35 is irradiated with this λ1 fundamental light. However, the reflection of the λ1 fundamental light from the entrance end face 35a can be prevented by the antireflection film 38a, so that the occurrence of return light in this portion can be reduced. Therefore, it is possible to prevent the λ1 fundamental light from returning to an active layer of the semiconductor laser 34 and to reduce noise caused by this return light.

In this embodiment, the semiconductor laser 34 and the SHG device 35 are coupled directly so as to reduce the size of the coherent light source 31. To enhance the coupling efficiency, the distance between the semiconductor laser 34 and the entrance end face 35a of the SHG device 35 should be controlled. When the distance is not less than 5 μm, a coupling loss of at least 1 dB occurs. The antireflection film 38a formed at the entrance end face 35a can decrease the distance by the amount corresponding to its thickness, thus improving the coupling efficiency between the semiconductor laser 34 and the SHG device 35.

When the λ1 fundamental light exits from the SHG device 35, the exit end face 35b of the SHG device 35 is irradiated with this λ1 fundamental light. However, the reflection of the 1 fundamental light from the exit end face 35b can be prevented by the antireflection film 38b, so that the occurrence of return light in this portion can be reduced. Therefore, it is possible to prevent the λ1 fundamental light from returning to the active layer of the semiconductor laser 34 and to reduce noise caused by this return light. Moreover, since the exit end face 35b is cut obliquely with respect to the propagation direction of a guided wave, it is difficult for the λ1 fundamental light that has been reflected from the exit end face 35b to enter the optical waveguide 33.

The coherent light source 31 of this embodiment is characterized also by an extremely small quantity of λ1 fundamental light that returns from the confocal optical system. The coherent light source 31 is intended mainly to utilize the harmonic light having a wavelength of λs (hereinafter, referred to as "λs harmonic light"), which is converted from the fundamental light, and the confocal optical system is adapted to the λs harmonic light. Therefore, the conditions of the confocal optical system are not applied to the λ1 fundamental light because of its chromatic aberration. Thus, the proportion of the λ1 fundamental light that returns from the outside to the coherent light source 31 becomes extremely small. As a result, light returning from the exit end face of the optical waveguide 33 to the semiconductor laser 34 can be reduced to −40 dB or less, so that noise caused by this return light can be suppressed.

The harmonic light reflected from the optical disk 43 passes through the quarter-wave plate 41 with its polarization rotated, then is reflected from the polarizing beam splitter 40, and is directed to a photodetector 44, thus providing a reproduction signal.

However, light that has been reflected from any location outside of the coherent light source 31 may return to the coherent light source 31. For example, when polarization is not performed sufficiently by the quarter-wave plate 41 due to birefringence of the optical disk 43 or the like, a portion of the harmonic light may pass through the polarizing beam splitter 40 and return to the side of the SHG device 35.

When the λs harmonic light returns from the outside to the coherent light source 31, the exit end face 35b of the SHG device 35 is irradiated with this λs harmonic light. However, the reflection of the λs harmonic light from the exit end face 35b can be prevented by the antireflection film 38b, so that the occurrence of reflected light in this portion can be reduced. Therefore, it is possible to prevent interference between the λs harmonic light emitted from the SHG device 35 and the reflected light and to reduce interference noise caused by this interference. The antireflection film 38b also can improve the efficiency of wavelength conversion from the fundamental light into the harmonic light.

The exit end face 35b of the SHG device 35 is cut obliquely with respect to the propagation direction of a guided wave. This makes it difficult for the λs harmonic light that has been reflected from the exit end face 35b to enter the optical waveguide 33. Therefore, it is possible to prevent interference between the λs harmonic light emitted from the SHG device 35 and the reflected light and to reduce interference noise caused by this interference.

The entrance end face 35a of the SHG device 35 is irradiated with the λs harmonic light that enters from the exit end face 35b. However, the reflection of the λs harmonic light from the entrance end face 35a can be prevented by the antireflection film 38a, so that the occurrence of reflected light in this portion can be reduced. Therefore, it is possible to prevent interference between the λ1 fundamental light entering the SHG device 35 and the reflected light and to reduce interference noise cause by this interference.

Moreover, the exit end face 34a of the semiconductor laser 34 is irradiated with the λs harmonic light. However, the reflection of the λs harmonic light from the exit end face 34a can be prevented by the antireflection film 37, so that the occurrence of reflected light in this portion can be reduced. Therefore, it is possible to prevent interference between the λ1 fundamental light emitted from the semiconductor laser 34 and the reflected light and to reduce interference noise caused by this interference. The semiconductor laser 34 has a refractive index of not less than 3 and causes a large Fresnel reflection. For this reason, noise caused by the interference between light reflected from the exit end face 34a and light emitted from the semiconductor laser 34 has been a problem in conventional techniques. However, the antireflection film 37 formed at the exit end face 34a of the semiconductor laser 34 can eliminate this problem.

To prevent the λs harmonic light that enters the semiconductor laser 34 from being reflected in the laser, it is desirable to employ a configuration in which the λs harmonic light is absorbed in the vicinity of the exit end face 34a of the semiconductor laser 34. When the wavelength λs is smaller than the wavelength λ1, the semiconductor laser 34 absorbs the λs harmonic light. That is, light passing through the antireflection film 37 is absorbed rapidly in the portion close to the exit end face 34a. Even if the wavelength λs is still smaller than the wavelength λ1 of the fundamental light, such as third and fourth harmonic light, noise caused by the return light can be reduced as well.

The following is an explanation of the particular case in which the wavelength λs of the harmonic light is more than the wavelength λ1 of the fundamental light. The harmonic light having a larger wavelength than that of the fundamental light can be generated, e.g., by using a difference frequency or parametric oscillation. When the wavelength λs is more than l1, the λs harmonic light is not absorbed by the semiconductor laser 34. Therefore, another structure for absorbing the λs harmonic light is necessary. For example, an absorption film (not shown) for absorbing the harmonic light is provided between the exit end face 34a and the antireflection film 37, and the harmonic light passing through the antireflection film 37 is absorbed by this absorption film, thus reducing interference noise. The structure capable of absorbing the harmonic light without affecting light emitted from the semiconductor laser 34 can be produced easily because the harmonic light differs from the emitted light in wavelength.

The configuration including the absorption film is effective also in the case where the wavelength λs is smaller than λ1. When the λs harmonic light returns directly from the outside to the exit end face 34a of the semiconductor laser 34 through the antireflection film 37, the state of oscillation of the semiconductor laser 34 may change at its end portion to cause noise. The effective solution to this problem is to absorb the returned λs harmonic light with the absorption film. As a material for the antireflection film 37, such a material that absorbs only the harmonic light and does not absorb light emitted from the semiconductor laser 34, e.g., Si, and $Bi_2O_3$, can be used. Alternately, a configuration in which only the harmonic light is dispersed may be used.

The configuration of this embodiment has the following two features:

First, to reduce noise caused by light returning to the semiconductor laser 34, the antireflection films 38a, 38b for the fundamental light are formed at the entrance end face 35a and the exit end face 35b of the SHG device 35, respectively. To reduce interference noise with the harmonic light, it is effective that the antireflection films 38a, 38b for the harmonic light are formed at the entrance end face 35a and the exit end face 35b of the SHG device 35, respectively. Therefore, it is effective that the entrance end face 35a and the exit end face 35b of the SHG device are provided with the antireflection films 38a, 38b for both the fundamental light and the harmonic light, respectively. Regarding the interference noise, in particular, an antireflection film for two wavelengths should be formed also at the surface where an antireflection film for a single wavelength is formed conventionally while considering the optical path of reflected light.

Second, the antireflection film 37 for the λs harmonic light, which is obtained by wavelength conversion with the SHG device 35, is formed at the exit end face 34a of the semiconductor laser 34. In particular, to avoid reducing the oscillation efficiency of the semiconductor laser 34 or the like, the antireflection film 37 needs to have both the reflection conditions for light emitted from the semiconductor laser 34 and the antireflection characteristics for the λs harmonic light. The exit end face 34a is provided with a multi-layer film whose reflectance with respect to light emitted from the semiconductor laser 34 is reduced so as to increase the oscillation efficiency and prevent the end face from being damaged. By using the multi-layer film structure that has a conventional reflectance with respect to light emitted from the semiconductor laser 34 and exhibits the antireflection effect for the harmonic light from the outside, the semiconductor laser 34 suitable for the SHG device 35 can be achieved without changing the manufacturing process and cost.

The configuration of the coherent light source 31 of this embodiment is useful particularly when the semiconductor laser 34 and the SHG device 35 are coupled directly. In such a direct coupling, the entrance end face of the optical waveguide 33 of the SHG device 35 is located close to the exit end face 34a of the semiconductor laser 34. Therefore, light that returns from the outside is reflected by the exit end face 34a and easily coupled to the optical waveguide 33, resulting in an interference noise component. However, when the semiconductor laser 34 and the SHG device 35 are coupled, e.g., by a coupling lens system, the reflection at the exit end face 34a is hardly a problem.

For example, assuming that the coupling lens system is used to couple light emitted from the semiconductor laser 34 to the optical waveguide 33, the light obtained by wavelength conversion (hereinafter, referred to as "wavelength-conversion light") returns from the outside, propagates in the optical waveguide 33, exits from the entrance end face 35a of the SHG device 35, and reaches the exit end face 34a of the semiconductor laser 34 through the coupling lens system. When the wavelength-conversion light is reflected from the exit end face 34a and passes through the coupling lens into the optical waveguide 33 again, it becomes an interference noise component. Actually, however, the quantity of light that travels through this path to become the interference noise component is extremely small. This is because chromatic aberration is caused in the coupling lens system due to a difference in wavelength between the light emitted from the semiconductor laser 34 and the wavelength-conversion light. Specifically, in the coupling lens system that has been formed for light emitted from the semiconductor laser 34, aberration of the wavelength-conversion light is increased to degrade its focusing property. Therefore, even if the wavelength-conversion light traces the same optical path as that of the light emitted from the semiconductor laser 34, the quantity of light to be coupled to the optical waveguide 33 is reduced significantly.

In this embodiment, the SHG device is used as the optical waveguide device. However, the optical waveguide device is not limited particularly thereto. For example, devices with various functions and configurations can be used, such as a high-speed modulation device, a phase shifter, a frequency shifter, and a polarization control device. The optical waveguide device of the present invention can be applied to all the above optical waveguide devices and the optical systems that use a coherent light source including the optical waveguide device.

The coherent light source that includes an SHG device often uses a high-coherence DBR semiconductor laser as the semiconductor laser to generate high-coherence harmonic light, which in turn causes interference noise easily. However, when the coherent light source is formed by using the optical waveguide device of the present invention as the SHG device, the interference noise can be reduced most effectively. For example, a coherent light source including a plurality of semiconductor lasers with different wavelengths and an SHG device, in which fundamental light having wavelengths of $\lambda 1, \lambda 2, \lambda 3, \ldots, \lambda n$ emitted from the respective semiconductor lasers is converted into harmonic light having wavelengths of $\lambda s1, \lambda s2, \lambda s3, \ldots, \lambda sn$ by the SHG device, needs to reduce interference noise for the harmonic light ($\lambda s1, \lambda s2, \lambda s3, \ldots, \lambda sn$). In this case, it is necessary that antireflection films for the harmonic light ($\lambda s1, \lambda s2, \lambda s3, \ldots, \lambda sn$) are formed at the exit end face of each of the semiconductor lasers. When a specific wavelength is determined to reduce the interference noise, the antireflection film corresponding to that wavelength should be provided.

In this embodiment, the antireflection film 37 is formed at the exit end face 34a of the semiconductor laser 34, and the antireflection films 38a, 38b are formed at the entrance end face 35a and the exit end face 35b of the SHG device 35, respectively. However, the present invention is not limited thereto. For example, the antireflection films 37, 38a may be formed only at the exit end face 34a and the entrance end face 35a, or the antireflection films 37, 38b may be formed only at the exit end faces 34a, 35b, respectively. Alternately, the antireflection film 37 may be formed only at the exit end face 34a, or the antireflection films 38a, 38b may be formed only at the entrance end face 35a and the exit end face 35b, respectively.

Figure 11:
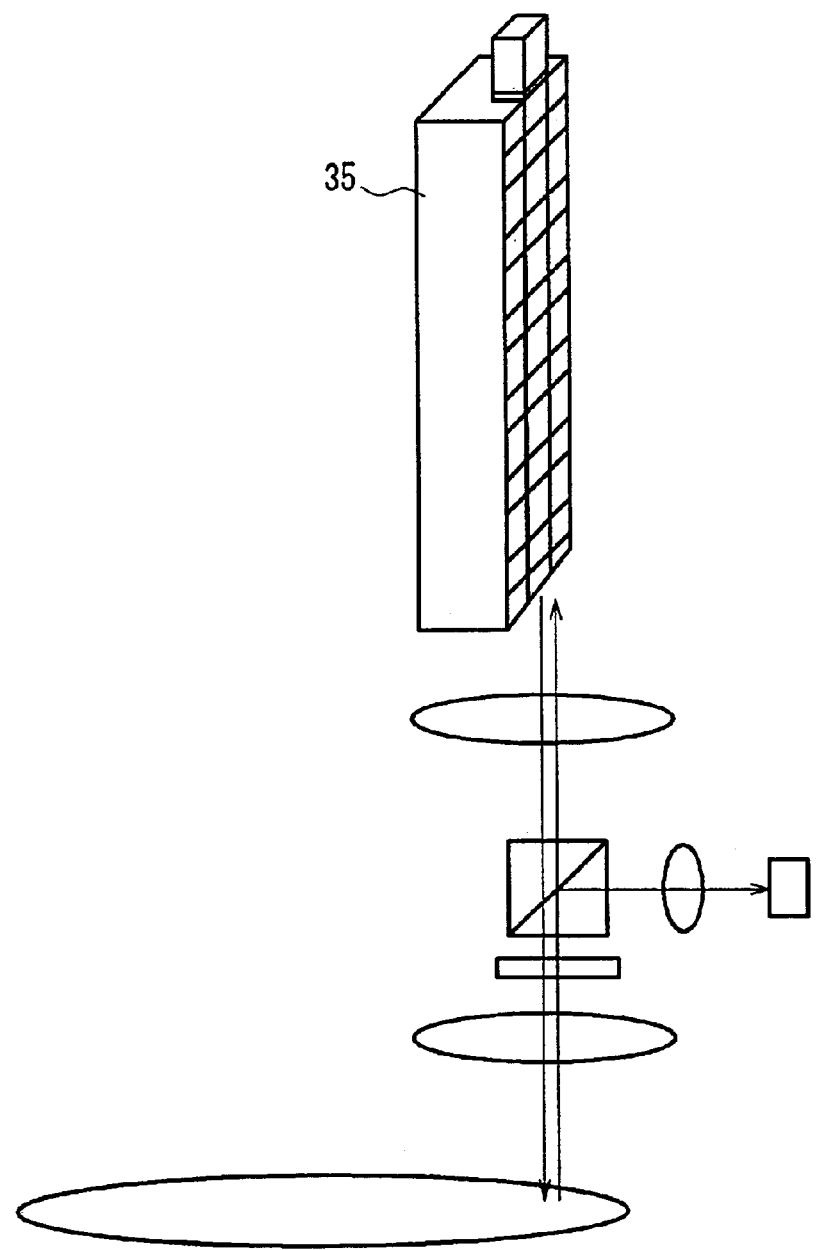
FIG. 11 is a schematic perspective view showing another example of a coherent light source according to a third embodiment of the present invention.

In this embodiment, the exit end face 35b of the SHG device 35 is cut obliquely with respect to the propagation direction of a guided wave. However, the present invention is not limited thereto. For example, the SHG device 35 may be a substantially rectangular parallelepiped, as shown in FIG. 11.

The following embodiments describe the method in which even if blue light (harmonic light) that is generated during reproduction of an optical disk returns to the optical waveguide of an optical waveguide device, the blue light is absorbed to eliminate the influence of return light, and thus a stable reproduction signal is obtained without causing degradation. They also describe the method for providing an optical waveguide device that can achieve a minimum waveguide loss of fundamental light and a high efficiency of conversion from the fundamental light into blue light.

Moreover, the following embodiments describe an SHG blue light source, in which an optical waveguide type quasi-phase-matched SHG device (hereinafter, referred to as "optical waveguide type QPM-SHG device") that is formed on an X-cut MgO-doped $LiNbO_3$ substrate is used as the optical waveguide device, and a wavelength-variable semiconductor laser that has the function of varying the wavelength with high coherence is used as the semiconductor laser.

Fourth Embodiment

This embodiment describes an optical waveguide device including a harmonic light absorption region that absorbs harmonic light and a harmonic light non-absorption region that does not absorb the harmonic light. In this optical waveguide device, fundamental light propagates in both the harmonic light absorption region and the harmonic light non-absorption region with a zero-order transverse mode, and waveguide mode sizes of the fundamental light in the two regions match.

Figure 12A:
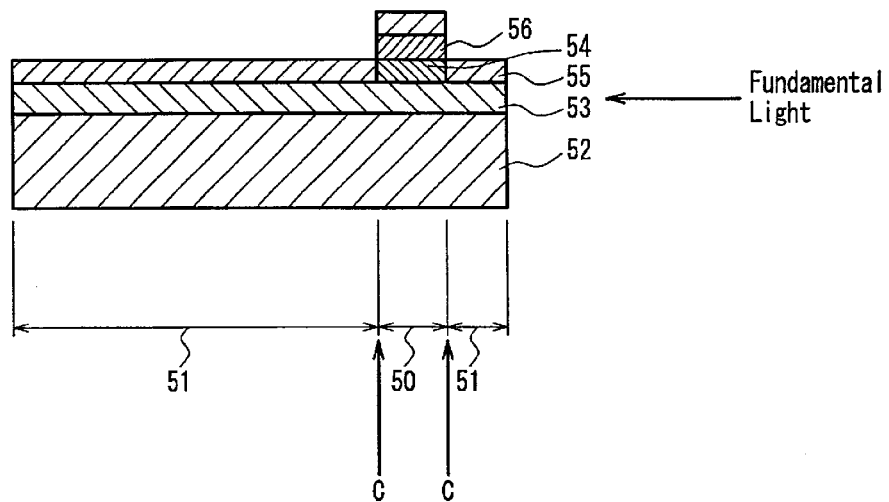
FIG. 12A is a schematic cross-sectional view showing an optical waveguide type QPM-SHG device according to a fourth embodiment of the present invention.

FIG. 12A shows the configuration of an optical waveguide type QPM-SHG device according to this embodiment. As shown in FIG. 12A, the waveguide structure in a harmonic light absorption region 50 differs from that in a harmonic light non-absorption region 51. In such an optical waveguide device, the waveguide mode size in each of the regions (the harmonic light absorption region 50 and the harmonic light non-absorption region 51) generally is different. Therefore, a portion of the guided wave is radiated from connections C between the harmonic light absorption region 50 and the harmonic light non-absorption region 51 into an X-cut MgO-doped $LiNbO_3$ substrate 52, causing waveguide power loss. This embodiment can minimize radiation loss of the fundamental light and achieve an efficient SHG blue light source by matching the waveguide mode sizes of the fundamental light in the two regions.

Figure 12B:
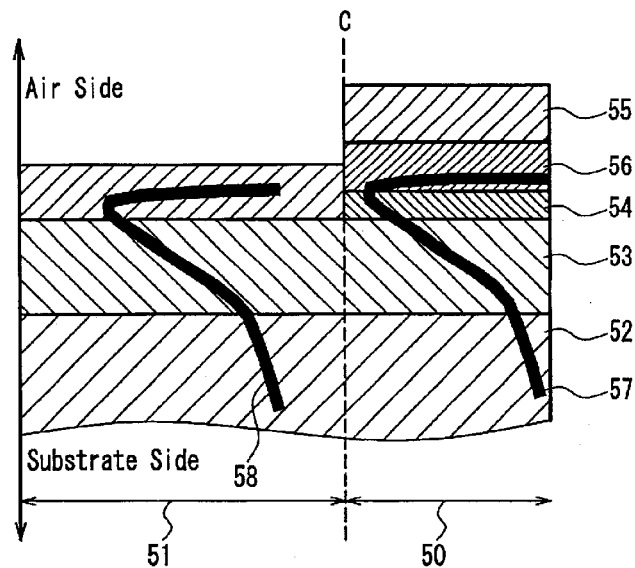
FIG. 12B is a schematic cross-sectional view showing the electric field distribution of a waveguide mode of the fundamental wave.

The waveguide structure is specifically as follows: a Si film 54 that acts as a harmonic light absorption film is formed on a proton-exchange optical waveguide 53 in the harmonic light absorption region 50, and a $Nb_2O_5$ film 55 having a high refractive index is formed on the proton-exchange optical waveguide 53 in the harmonic light non-absorption region 51. The guided wave propagates in a waveguide layer (the proton-exchange optical waveguide 53) and the $Nb_2O_5$ film 55 in the harmonic light non-absorption region 51, while the guided wave propagates in the waveguide layer and the Si film 54 in the harmonic light absorption region 50. Here, the refractive indexes of the Si film 54 and the $Nb_2O_5$ film 55 in the wavelength region of the fundamental light are about 3.4 and 2.4, respectively, which are higher than the refractive index (about 2.2) of the waveguide layer. The guided wave tends to concentrate in the high refractive index portion. Therefore, as shown in FIG. 12B, electric field distributions 57, 58 of the waveguide modes of the fundamental light are distributed unevenly above the substrate 52 and become asymmetric with an increase in thickness of the $Nb_2O_5$ film 55 and the Si film 54. The reason for the use of the $Nb_2O_5$ film 55 having a high refractive index in the harmonic light non-absorption region 51 is that the waveguide mode of the fundamental light is drawn to the surface of the proton-exchange optical waveguide 53 so as to provide a large overlap between the fundamental light and the harmonic light, and thus high efficiency of wavelength conversion can be expected. In the optical waveguide type QPM-SHG device (the optical waveguide device) of this embodiment, these characteristics are used to optimize the thickness of the Si film 54 so that the waveguide mode sizes of the fundamental light in the harmonic light absorption region 50 and the harmonic light non-absorption region 51 match. In other words, the thickness of the Si film 54 is optimized so that the effective refractive index of the harmonic light absorption region 50 matches that of the harmonic light non-absorption region 51. Here, the Si film 54 (the harmonic light absorption film) is located in the vicinity of the fundamental light entrance end face in order to ensure a maximum output of blue light to be generated. For example, if the Si film 54 is positioned in the center of the optical waveguide device, all the blue light that has been generated in the portion before the Si film 54 is absorbed by this film, and thus output of the blue light is reduced.

Next, a method for producing the optical waveguide type QPM-SHG device as the optical waveguide device of this embodiment will be described. First, the optical waveguide 53 is formed on the X-cut MgO-doped $LiNbO_3$ substrate 52 by a proton exchange method. Then, the Si film 54 and a $SiO_2$ film 56 are formed in sequence on the proton-exchange optical waveguide 53. The Si film 54 and the $SiO_2$ film 56 are patterned by photolithography and etching, and the $Nb_2O_5$ film 55 is formed on the entire surface. Here, the $SiO_2$ film 56 is a low refractive index buffer layer that prevents the influence of the $Nb_2O_5$ film 55, which is formed on the upper face of the $SiO_2$ film 56, upon the waveguide mode size in the portion provided with the Si film 54 (the harmonic light absorption region 50).

The refractive indexes of the $Nb_2O_5$ film formed by sputtering and the Si film formed by electron-beam deposition with respect to light (fundamental light) having a wavelength of 800 nm are measured beforehand, resulting in 2.3 and 3.0, respectively. Using these values, the waveguide mode size of the fundamental light was calculated by computer simulation. The result showed that the optimum thickness of the Si film was 20 nm when the $Nb_2O_5$ film had a thickness of 170 nm. Next, sample devices (the optical waveguide type QPM-SHG device) having the above configuration were produced under the conditions that the thickness of the $Nb_2O_5$ film 55 was set to 170 nm and the thickness of the Si film 54 was varied, and then the waveguide mode size of the fundamental light was observed. Like the computer simulation, when the thickness of the Si film 54 was 20 nm, the waveguide mode size of the fundamental light in the portion provided with the Si film 54 (the harmonic light absorption region 50) matched well that in the portion provided with the $Nb_2O_5$ film 55 (the harmonic light non-absorption region 51). A difference in waveguide mode size of the fundamental light between the two regions was within 10%. Moreover, the guided wave propagation efficiency of a sample device was measured, in which the length of the Si film 54 in the propagation direction of a guided wave was 0.2 mm. The result confirmed that the waveguide loss of the fundamental light was not more than 5% and the transmittance of the harmonic light was 5% in the portion provided with the Si film 54 (the harmonic light absorption region 50).

In the optical waveguide device (the optical waveguide type QPM-SHG device) of this embodiment, the waveguide loss of the fundamental light propagating in the portion provided with the Si film 54 (the harmonic light absorption region 50) is not more than 5%. Therefore, a reduction in output of blue light caused by adding the Si film 54 as the harmonic light absorption film can be suppressed within 10%. Here, the blue light is generated in proportion to the square of waveguide power of the fundamental light.

In the optical waveguide device produced by using the Si film 54 having a thickness of 15 nm, which differs from the optimum value, a difference in waveguide mode size of the fundamental light between the portion provided with the Si film 54 (the harmonic light absorption region 50) and that provided with the $Nb_2O_3$ film 55 (the harmonic light non-absorption region 51) was 50%. The guided wave propagation efficiency of a sample device was measured, in which the length of the Si film 54 in the propagation direction of a guided wave was 0.2 mm. The result confirmed that the waveguide loss of the fundamental light propagating in the portion provided with the Si film 54 (the harmonic light absorption region 50) was 20%. The output of blue light was reduced by about 40% compared with a device that did not include the Si film 54 as the harmonic light absorption film.

The above results proved that, like the optical waveguide type QPM-SHG device of this embodiment, when the thickness of the Si film 54 (the harmonic light absorption film) is optimized so that the waveguide mode sizes of the fundamental light in the harmonic light absorption region 50 and the harmonic light non-absorption region 51 match, a high-power SHG blue light source can be achieved.

Figure 13:
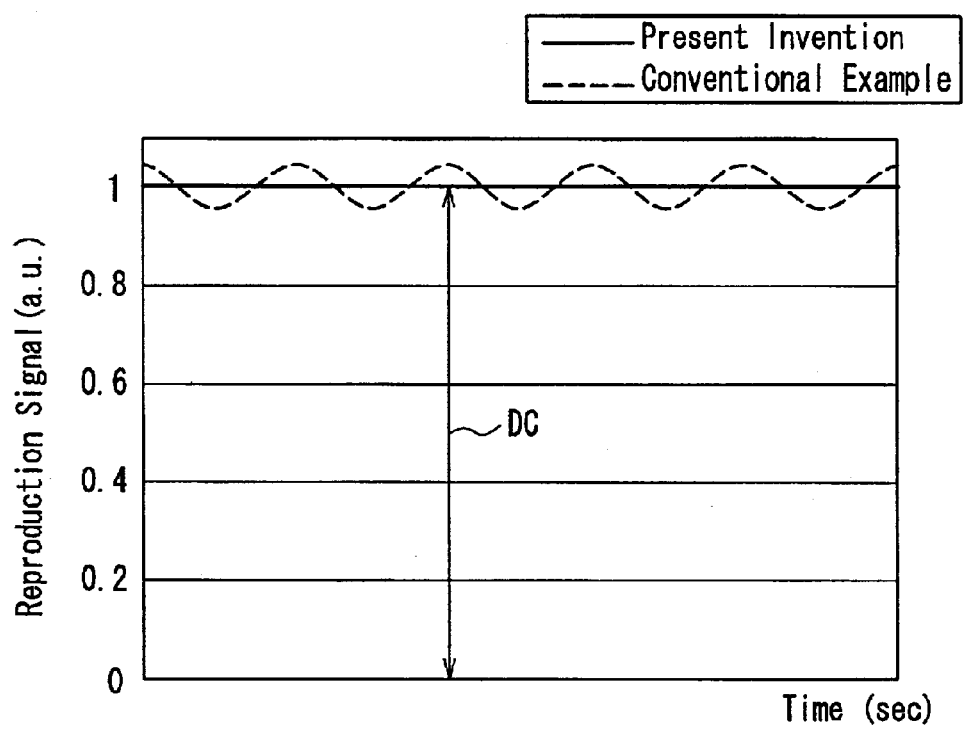
FIG. 13 shows a reproduction signal from a disk with a mirror-finished surface according to a fourth embodiment of the present invention.

SHG blue light sources were produced by using the optical waveguide device (the optical waveguide type QPM-SHG device) of this embodiment and a conventional optical waveguide device (the optical waveguide type QPM-SHG device) that did not include the harmonic light absorption film (i.e., a blue light absorption portion). Then, each of the SHG blue light sources was mounted on an optical pickup. Using these optical pickups, reproduction signals from optical disks, each having a mirror surface, were compared and evaluated. FIG. 13 shows a change in the reflected light intensity signals (reproduction signals), observed over time. Basically, a reproduction signal from an optical disk having a mirror surface takes a constant value. However, interference noise amplitude of about 4% in terms of DC component ratio was observed in the reproduction signal when the conventional optical waveguide device was used. On the other hand, the interference noise was suppressed to 0.1% or less when the optical waveguide device of this embodiment was used, and thus the noise reduction effect was confirmed.

In summary, the optical waveguide device of this embodiment absorbs blue light that is obtained by wavelength conversion with a harmonic light absorption film in an SHG blue light source. Therefore, even if the blue light is reflected from an optical disk and returns to the SHG blue light source, the device is unaffected by the return light and can reproduce the optical disk with lower noise. Thus, the optical waveguide device of this embodiment has a large practical effect. In this embodiment, the Si film 54 having an optimum thickness is formed in the harmonic light absorption region 50 that is located in the vicinity of the entrance end face of the proton-exchange optical waveguide 53, on which fundamental light is incident. With this configuration, a waveguide mode size of the fundamental light propagating in the proton-exchange optical waveguide 53 in the harmonic light non-absorption region 51 matches that of the fundamental light propagating in the proton-exchange optical waveguide 53 in the harmonic light absorption region 50, thereby reducing the waveguide loss of the fundamental light at a connection between the harmonic light absorption region 50 and the harmonic light non-absorption region 51. This allows the fundamental light to propagate efficiently in the proton-exchange optical waveguide 53, so that blue light can be obtained efficiently. Thus, the optical waveguide device of this embodiment has a large practical effect.

In this embodiment, a Si film is used as the harmonic light absorption film. However, a material for the harmonic light absorption film is not particularly limited, as long as the extinction coefficient in the wavelength region of harmonic light is larger than that in the wavelength region of fundamental light. For example, a ZnSe film and a GaP film are useful for the harmonic light absorption film. Their extinction coefficient is smaller than that of the Si film in the wavelength region of fundamental light and is larger in the wavelength region of harmonic light. Thus, they can propagate the fundamental light more efficiently and absorb the harmonic light more efficiently.

The harmonic light absorption film is not limited to a semiconductor film, and a dielectric film with a large refractive index may be used. For example, a $TiO_2$ film, which is an oxide dielectric film, has a large refractive index, but a small extinction coefficient in the wavelength region of harmonic light. However, it is generally known that the extinction coefficient can be increased by reducing the amount of oxygen included in the film. A film that contains a small amount of oxygen as expressed by $TiO_x$ (X<2) can be provided by reducing an oxygen partial pressure during the film formation. The experiment confirmed that the harmonic light can be absorbed sufficiently by using a film expressed by $TiO_x$ (x<1.9). When a film expressed by $TiO_x$ (x<1.8) is used, the extinction coefficient becomes even larger, so that the length of the harmonic light absorption region in the propagation direction of a guided wave can be reduced. When a film expressed by $TiO_x$ (x<1.7) is used, absorption loss of the fundamental light is increased, and thus the fundamental light cannot propagate efficiently in the optical waveguide.

In the above explanation, the configuration is optimized so that the high refractive index film formed in the harmonic light non-absorption region should be equivalent to the harmonic light absorption film. The following is an explanation of the configuration in which waveguide mode sizes of the fundamental light in the harmonic light absorption region and the harmonic light non-absorption region match even when the high refractive index film is not formed in the harmonic light non-absorption region. In this case, a light trapping effect is increased by forming the harmonic light absorption film. To compensate for such an increase, the light trapping effect of the optical waveguide is reduced beforehand.

Figure 14:
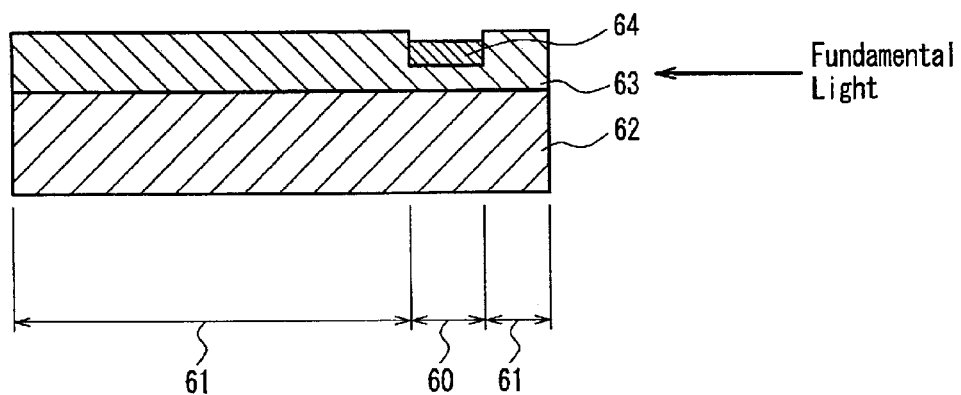
FIG. 14 is a schematic cross-sectional view showing another example of an optical waveguide type QPM-SHG device according to a fourth embodiment of the present invention.

In an optical waveguide type QPM-SHG device illustrated in FIG. 14, the upper portion of a proton-exchange optical waveguide 63 in a harmonic light absorption region 60 is removed so as to have a smaller thickness than that of the proton-exchange optical waveguide 63 in a harmonic light non-absorption region 61. A Si film 64 that acts as a harmonic light absorption film is formed in the removed portion. In FIG. 14, reference numeral 62 denotes an X-cut MgO-doped $LiNbO_3$ substrate. Even with this configuration, the thickness of the Si film 64 can be optimized so that the waveguide mode size of the fundamental light propagating in the proton-exchange optical waveguide 63 in the harmonic light non-absorption region 61 matches substantially that of the fundamental light propagating in the proton-exchange optical waveguide 63 in the harmonic light absorption region 60, allowing the fundamental light to propagate efficiently in the proton-exchange optical waveguide 63. Therefore, the same effect as that of the optical waveguide device in FIG. 12 can be obtained.

Figure 15:
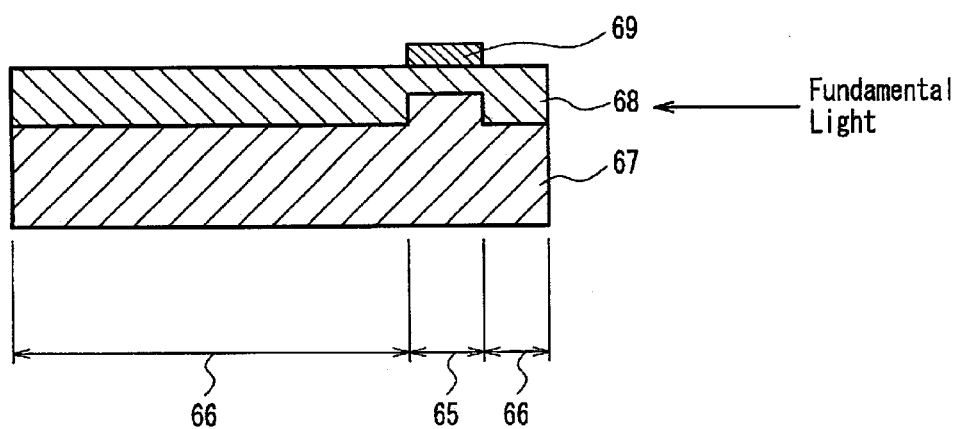
FIG. 15 is a schematic cross-sectional view showing yet another example of an optical waveguide type QPM-SHG device according to a fourth embodiment of the present invention.

In an optical waveguide type QPM-SHG device illustrated in FIG. 15, the substantial thickness of a proton-exchange optical waveguide 68 in a harmonic light absorption region 65 is set to be smaller than that of the proton-exchange optical waveguide 68 in a harmonic light non-absorption region 66. A Si film 69 that act as a harmonic light absorption film is formed on the upper face of the proton-exchange optical waveguide 68 in the harmonic light absorption region 65. Even with this configuration, the thickness of the Si film 69 can be optimized so that the waveguide mode size of the fundamental light propagating in the proton-exchange optical waveguide 68 in the harmonic light non-absorption region 66 matches substantially that of the fundamental light propagating in the proton-exchange optical waveguide 68 in the harmonic light absorption region 65, allowing the fundamental light to propagate efficiently in the proton-exchange optical waveguide 68. Therefore, the same effect as that of the optical waveguide device in FIG. 12 can be obtained. The optical waveguide with different depths as shown in FIG. 15 can be produced easily by preparing the harmonic light absorption region 65 and the harmonic light non-absorption region 66 separately while adjusting their respective proton exchange time.

Figure 16:
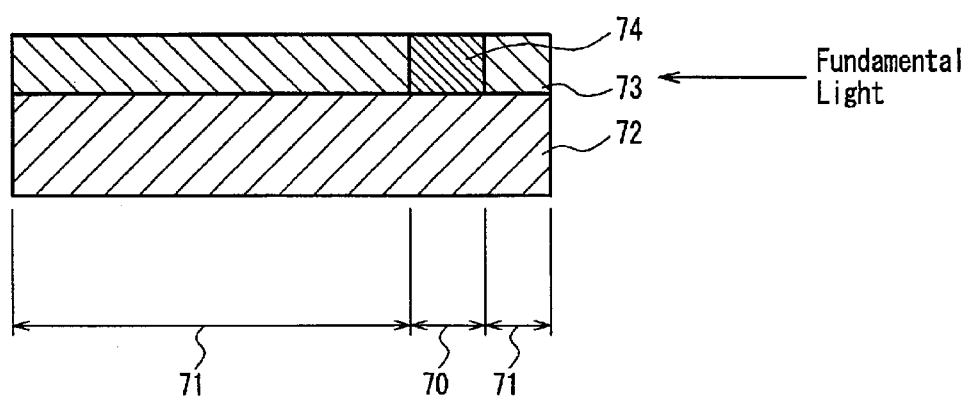
FIG. 16 is a schematic cross-sectional view showing yet another example of an optical waveguide type QPM-SHG device according to a fourth embodiment of the present invention.

In this embodiment, the Si film that acts as the harmonic light absorption film is formed on the upper face of the proton-exchange optical waveguide to provide the harmonic light absorption region. However, the present invention is not limited to this configuration. For example, as shown in FIG. 16, a harmonic light absorption region 70 may be formed by mixing and diffusing metal such as iron in a proton-exchange optical waveguide 73. This configuration can eliminate unevenness on the substrate surface caused by forming the harmonic light absorption film. Therefore, it is suitable for precise face down mounting with the waveguide plane oriented toward the mounting substrate. In FIG. 16, reference numeral 71 denotes a harmonic light non-absorption region, 72 denotes an X-cut MgO-doped $LiNbO_3$ substrate, and 74 denotes a metal mixed diffusion layer.

Fifth Embodiment

This embodiment describes an optical waveguide device having the configuration as follows: fundamental light propagates in a harmonic light non-absorption region with a zero-order transverse mode and in a harmonic light absorption region with a higher-order transverse mode of not less than first order, and waveguide mode sizes of the fundamental light in the two regions match.

Figure 17A:
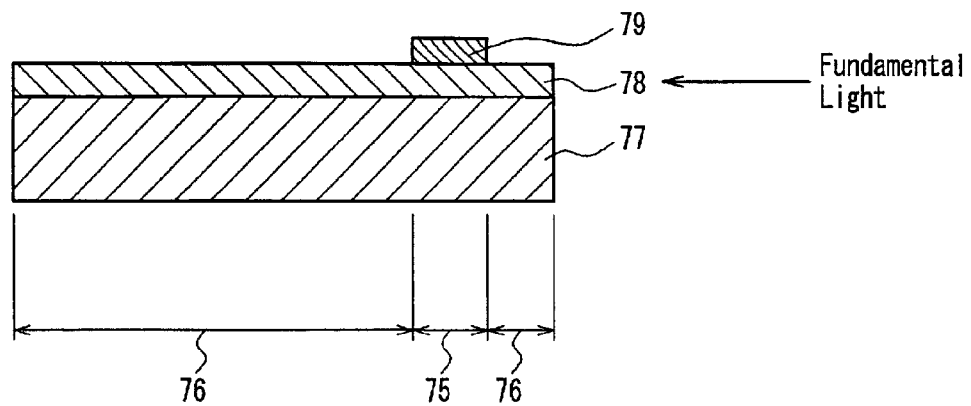
FIG. 17A is a schematic cross-sectional view showing an optical waveguide type QPM-SHG device according to a fifth embodiment of the present invention.
Figure 17B:
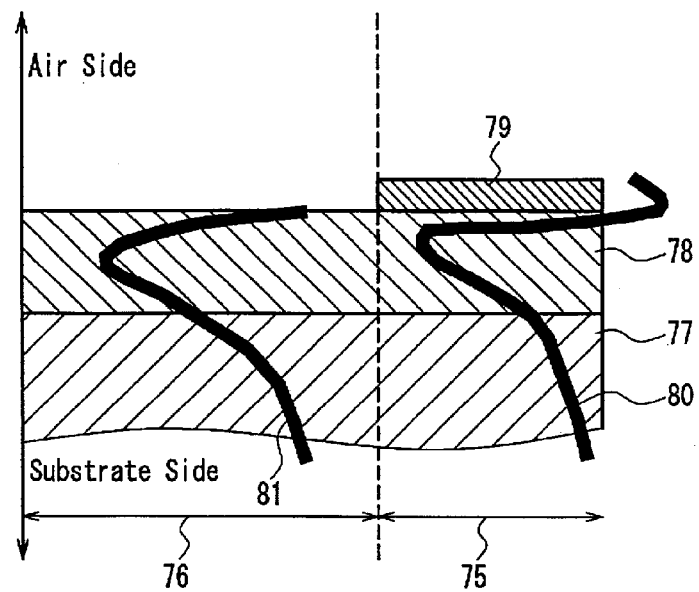
FIG. 17B is a schematic cross-sectional view showing the electric field distribution of a waveguide mode of the fundamental wave.

FIG. 17A shows the configuration of an optical waveguide type QPM-SHG device according to this embodiment. As shown in FIG. 17A, this embodiment employs the waveguide structure in which a Si film 79 that act as a harmonic light absorption film is formed on a proton-exchange optical waveguide 78 in a harmonic light absorption region 75. As shown in FIG. 17B, the fundamental light propagates in the proton-exchange optical waveguide 78 in a harmonic light non-absorption region 76 with a zero-order transverse mode, while it propagates in the proton-exchange optical waveguide 78 in the harmonic light absorption region 75 provided with the Si film 79 as the harmonic light absorption film with a first-order transverse mode. In the fourth embodiment, to control the fundamental light propagating in the proton-exchange optical waveguide in the harmonic light absorption region provided with the Si film as the harmonic light absorption film with the zero-order transverse mode, the buffer layer should be included or the effective refractive index of the waveguide layer should be reduced. This embodiment allows the fundamental light to propagate in the proton-exchange optical waveguide 78 in the harmonic light absorption region 75 with the first-order transverse mode only by forming the Si film 79 to a desired thickness and patterning it so as to have a desired length in the propagation direction of a guided wave. Therefore, the manufacturing process can be simplified. Moreover, when the thickness of the Si film 79 is optimized so that the fundamental light propagates in the proton-exchange optical waveguide 78 in the harmonic light absorption region 75 with the first-order transverse mode, and the waveguide mode sizes of the fundamental light in the harmonic light absorption region 75 and the harmonic light non-absorption region 76 match, the thickness of the Si film 79 becomes larger than that in the fourth embodiment. In other words, the electric field distribution of the harmonic light entering the Si film 79 is increased. Therefore, to obtain about the same transmittance for harmonic light propagating in the portion provided with the Si film 79 (the harmonic light absorption region 75) as that in the fourth embodiment, the length of the Si film 79 in the propagation direction of a guided wave can be reduced. In this manner, about the same transmittance for the harmonic light as that in the fourth embodiment can be obtained by the Si film 79 whose length in the propagation direction is smaller than that of the Si film 64. Therefore, the interaction length between the fundamental light and blue light, i.e., the blue light generation region, can be enlarged. Thus, the optical waveguide device (the optical waveguide type QPM-SHG device) of this embodiment has a large practical effect.

Next, a method for producing the optical waveguide type QPM-SHG device as the optical waveguide device of this embodiment will be described. First, the optical waveguide 78 is formed on an X-cut MgO-doped LiNbO$_3$ substrate 77 by a proton exchange method. Then, the Si film 79 that acts as the harmonic light absorption film is formed on the proton-exchange optical waveguide 78. The Si film 79 is patterned by photolithography and etching so as to have a desired length in the propagation direction of a guided wave.

Like the fourth embodiment, the waveguide mode size of the fundamental light was calculated by computer simulation, and the thickness of the Si film 79 was optimized (1800 nm). The result confirmed that when the length of the Si film 79 in the propagation direction was 0.1 mm, the waveguide loss of the fundamental light was not more than 5% and the transmittance for the harmonic light was reduced to 1% or less in the portion provided with the Si film 79 (the harmonic light absorption region 75).

An SHG blue light source was produced by using the optical waveguide device (the optical waveguide type QPM-SHG device) of this embodiment. Then, the SHG blue light source was mounted on an optical pickup. Using this optical pickup, a reproduction signal from a disk having a mirror surface was evaluated. As a result, interference noise amplitude (see FIG. 13) in the reproduction signal from the disk was kept not more than a measuring limit, while it was about 4% for a conventional optical waveguide device (the optical waveguide type QPM-SHG device) that did not include the harmonic light absorption film. Thus, it was confirmed that the optical waveguide device of this embodiment can reduce interference noise.

In this embodiment, a Si film is used as the harmonic light absorption film, like the fourth embodiment. However, a material for the harmonic light absorption film is not particularly limited, as long as the extinction coefficient in the wavelength region of harmonic light is larger than that in the wavelength region of fundamental light.

Figure 18:
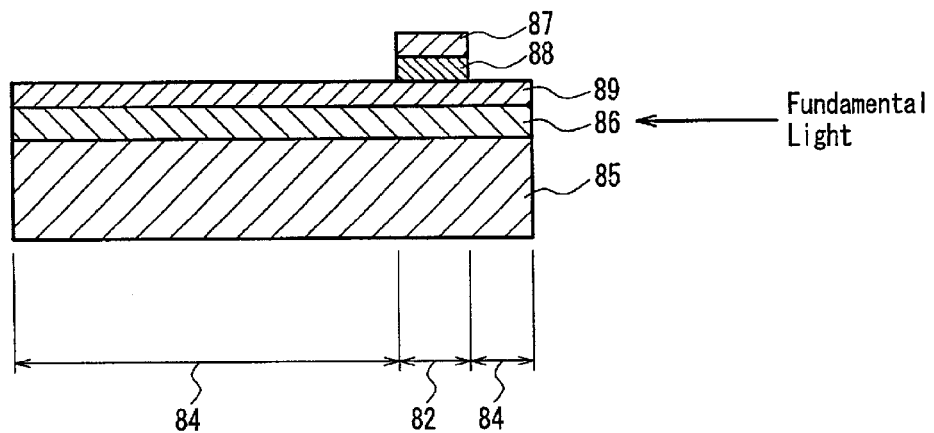
FIG. 18 is a schematic cross-sectional view showing another example of an optical waveguide type QPM-SHG device according to a fifth embodiment of the present invention.

As shown in FIG. 18, a Nb$_2$O$_5$ film 89 is formed on a proton-exchange optical waveguide 86 as a high refractive index layer, and a Si film 87 that acts as a harmonic light absorption film is formed on the upper face of the Nb$_2$O$_5$ film 89 in a harmonic light absorption region 82. This configuration also can provide the same effect as that of this embodiment. Since the Nb$_2$O$_5$ film 89 having a high refractive index is used, the waveguide mode of fundamental light is drawn to the surface of the proton-exchange optical waveguide 86 so as to provide large overlap between the fundamental light and the harmonic light, and thus high efficiency of wavelength conversion can be expected. In this case, the Si film 87 peels off easily because of its poor adhesion to the Nb$_2$O$_5$ film 89. Therefore, a SiO$_2$ film 88, which has good adhesive property to the Si film 87, is interposed between the Nb$_2$O$_5$ film 89 and the Si film 87. In FIG. 18, reference numeral 84 denotes a harmonic light non-absorption region.

Figure 19:
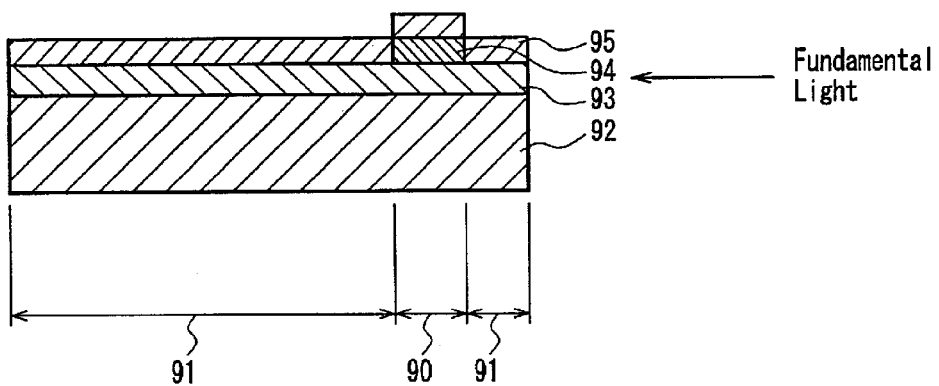
FIG. 19 is a schematic cross-sectional view showing yet another example of an optical waveguide QPM-SHG device according to a fifth embodiment of the present invention.

As shown in FIG. 19, a proton-exchange optical waveguide 93 and a Nb$_2$O$_5$ film 95 are stacked via a Si film 94 that acts as a harmonic light absorption film. This configuration also can provide the same effect as that of this embodiment. In this configuration, the Si film 94 is located between an X-cut MgO-doped LiNbO$_3$ substrate 92 and the Nb$_2$O$_5$ film 95 and does not peel off because of its good adhesion to the substrate 92. In FIG. 19, reference numeral 90 denotes a harmonic light absorption region and 91 denotes a harmonic light non-absorption region.

In this embodiment, the Si film that act as the harmonic light absorption film is formed on the upper face of the proton-exchange optical waveguide to provide the harmonic light absorption region. However, the present invention is not limited to this configuration. For example, the harmonic light absorption region may be formed by mixing and diffusing metal such as iron in the proton-exchange optical waveguide.

Sixth Embodiment

Figure 20:
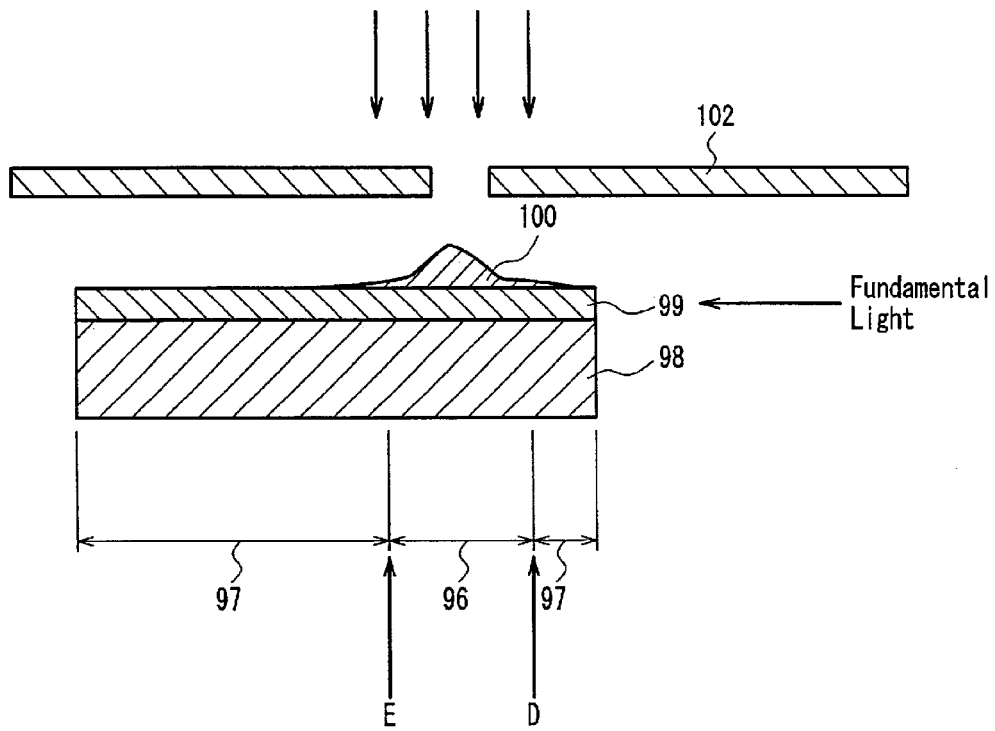
FIG. 20 is a schematic cross-sectional view showing an optical waveguide type QPM-SHG device according to a sixth embodiment of the present invention.

FIG. 20 is a cross-sectional view showing the configuration of an optical waveguide type QPM-SHG device as an optical waveguide device according to a sixth embodiment of the present invention.

Unlike the fourth and fifth embodiments, this embodiment reduces the radiation loss of fundamental light due to mismatch in waveguide modes by eliminating discontinuity of the waveguide modes. As shown in FIG. 20, this embodiment employs the waveguide structure in which a Si film 100 that acts as a harmonic light absorption film is formed on a proton-exchange optical waveguide 99 in a harmonic light absorption region 96. Here, the substantial thickness of the Si film 100 changes continuously in the harmonic light absorption region 96. Therefore, a waveguide mode size of the fundamental light propagating in the proton-exchange optical waveguide 99 in the harmonic light absorption region 96 changes continuously, and the waveguide mode sizes at the entrance end and the exit end of the harmonic light absorption region 96 match a waveguide mode size of the fundamental light propagating in the proton-exchange optical waveguide 99 in a harmonic light non-absorption region 97. This allows the fundamental light to propagate efficiently in waveguide mode converting portions D, E between the harmonic light absorption region 96 and the harmonic light non-absorption region 97, so that blue light can be obtained efficiently.

The optical waveguide type QPM-SHG device as the optical waveguide device of this embodiment is produced in the following manner: The optical waveguide 99 is formed on an X-cut MgO-doped LiNbO$_3$ substrate 98 by a proton exchange method. Then, the Si film 100 that acts as the harmonic light absorption film is formed in the vicinity of the entrance end face of the proton-exchange optical waveguide 99. Here, the Si film 100 is formed so that the thickness increases gradually and continuously from the entrance side to the exit side in the waveguide mode converting portion D, while it decreases gradually and continuously from the entrance side to the exit side in the waveguide mode converting portion E. As shown in FIG. 20, a slit 102 is placed at a certain distance away from the substrate 98. Forming the Si film 100 with this slit makes it easy to change the thickness gradually and continuously. The film thickness distribution and the length in the propagation direction of a guided wave of the Si film 100 can be changed freely by a slit width of the slit 102 and the distance between the slit 102 and the substrate 98.

It was confirmed that the transmittance of blue light propagating in the portion provided with the Si film 100 (the harmonic light absorption region 96) can be reduced to 1% or less by using the waveguide structure of this embodiment.

An SHG blue light source was produced by using the optical waveguide device (the optical waveguide type QPM-SHG device) of this embodiment. Then, the SHG blue light source was mounted on an optical pickup. Using this optical pickup, a reproduction signal from a disk having a mirror surface was evaluated. As a result, interference noise amplitude (see FIG. 13) in the reproduction signal from the disk was kept not more than a measuring limit, while it was about 4% for a conventional optical waveguide device (the optical waveguide type QPM-SHG device) that did not include the harmonic light absorption film. Thus, it was confirmed that the optical waveguide device of this embodiment can reduce interference noise.

This embodiment reduces radiation loss of the fundamental light due to mismatch in waveguide modes by eliminating discontinuity of the waveguide modes. Thus, the fundamental light can propagate efficiently, so that blue light can be obtained efficiently. Therefore, this embodiment has a large practical effect. Since the slit 102 is used in forming the Si film 100, photolithography and etching are not necessary. Thus, the manufacturing process can be simplified, which leads to a large practical effect.

In this embodiment, a Si film, which is a semiconductor film, is used as the harmonic light absorption film, like the fourth embodiment. However, a material for the harmonic light absorption film is not particularly limited, as long as the extinction coefficient in the wavelength region of harmonic light is larger than that in the wavelength region of fundamental light.

Seventh Embodiment

Figure 21:
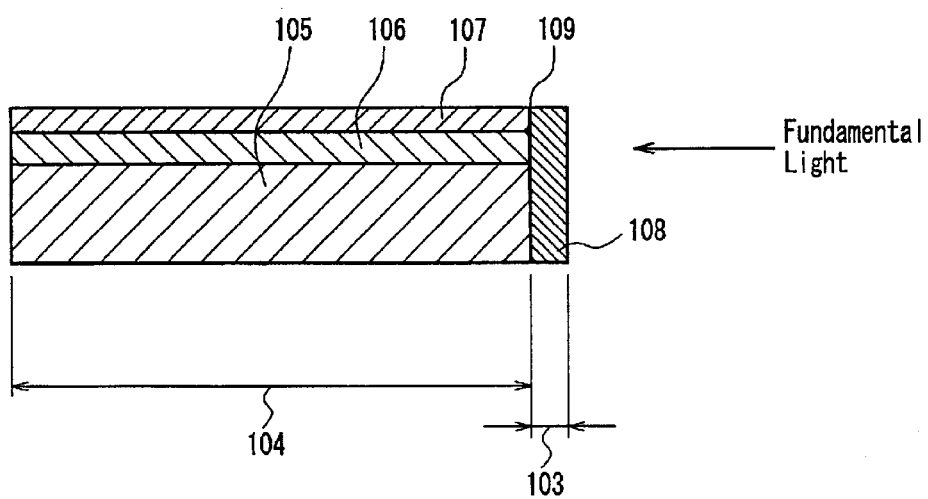
FIG. 21 is a schematic cross-sectional view showing an optical waveguide type QPM-SHG device according to a seventh embodiment of the present invention.
Figure 22:
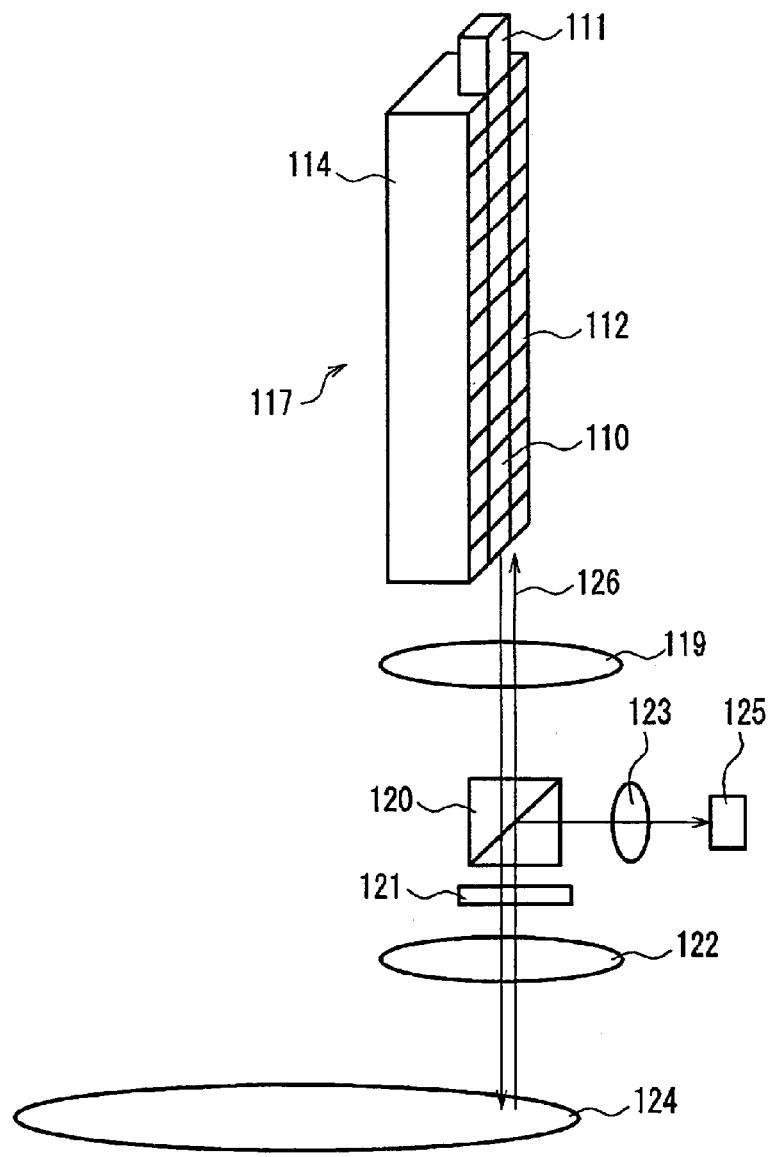
FIG. 22 is a schematic perspective view showing an example of an SHG blue light source.

FIG. 21 is a cross-sectional view showing the configuration of an optical waveguide type QPM-SHG device as an optical waveguide device according to a seventh embodiment of the present invention.

As shown in FIG. 21, this embodiment employs the waveguide structure in which a $Nb_2O_5$ film 107 having a high refractive index is formed on a proton-exchange optical waveguide 106, and a $TiO_2$ film that acts as a harmonic light absorption film is formed at an entrance end face 109.

Next, a method for producing the optical waveguide type QPM-SHG device as the optical waveguide device of this embodiment will be described. First, the optical waveguide 106 is formed on an X-cut MgO-doped $LiNbO_3$ substrate 105 by a proton exchange method. Then, the $Nb_2O_5$ film 107 is formed on the proton-exchange optical waveguide 106. Thereafter, the $TiO_2$ film that acts as the harmonic light absorption film is formed at the entrance end face 109.

With this configuration, fundamental light is coupled efficiently to the proton-exchange optical waveguide 106, and harmonic light is absorbed by the $TiO_2$ film 108. This is because the extinction coefficient of the $TiO_2$ film 108 is small in the wavelength region of the fundamental light, and the extinction coefficient of the $TiO_2$ film in the wavelength region of the harmonic light is larger than that in the wavelength region of the fundamental light.

An SHG blue light source was produced by using the optical waveguide device (the optical waveguide type QPM-SHG device) of this embodiment. Then, the SHG blue light source was mounted on an optical pickup. Using this optical pickup, a reproduction signal from a disk having a mirror surface was evaluated. As a result, interference noise amplitude (see FIG. 13) in the reproduction signal from the disk was reduced to 0.1% or less, while it was about 4% for a conventional optical waveguide device (the optical waveguide type QPM-SHG device) that did not include the harmonic light absorption film. Thus, it was confirmed that the optical waveguide device of this embodiment can reduce interference noise.

In this embodiment, a $TiO_2$ film 108 is used as the harmonic light absorption film. However, a material for the harmonic light absorption film is not particularly limited, as long as the extinction coefficient in the wavelength region of harmonic light is larger than that in the wavelength region of fundamental light. The refractive index of the $TiO_2$ film 108 is close to that of the proton-exchange optical waveguide 106. Therefore, using the $TiO_2$ film 108 as the harmonic light absorption film can reduce Fresnel reflection at the interface between the proton-exchange optical waveguide 106 and the harmonic light absorption film.

In the SHG blue light sources using the optical waveguide type QPN-SHG device as described in the fourth to seventh embodiments, optical coupling is performed by directly coupling the semiconductor laser and the optical waveguide type QPM-SHG device. Therefore, care should be taken with respect to interference noise caused by blue light that is reflected from the exit end face of the semiconductor laser. However, the interference noise caused by blue light that is reflected from the exit end face of the semiconductor laser can be reduced by using the optical waveguide type QPM-SHG device with the configuration as described in the fourth to seventh embodiments.

In the SHG blue light sources in the fourth to seventh embodiments, a wavelength-variable semiconductor laser that has the function of varying the wavelength with high coherence is used as the semiconductor laser. Therefore, the harmonic light obtained by wavelength conversion also has high coherence, so that interference noise occurs easily. However, the interference noise can be reduced more efficiently by using the optical waveguide type QPM-SHG device with the configuration as described in the fourth to seventh embodiments.

In the fourth to seventh embodiments, the SHG device is used as the optical waveguide device. However, the optical waveguide device is not limited particularly thereto. For example, devices with various functions and configurations can be used, such as a high-speed modulation device, a phase shifter, a frequency shifter, and a polarization control device. The optical waveguide device of the present invention can be applied to all the above optical waveguide devices and the optical systems that use a coherent light source including the optical waveguide device. A light source that includes the SHG device often uses a high-coherence DBR semiconductor laser as the semiconductor laser to generate high-coherence harmonic light, which in turn causes interference noise easily. However, when the light source is combined with the optical waveguide device of this embodiment, the interference noise can be reduced most effectively.

In each of the above embodiments, the confocal optical system is described by taking the optical pickup system as example. The present invention, however, also can be applied to other coherent optical systems, such as a laser scanning microscope and a laser printer. In particular, the optical waveguide device of the present invention is suitable for the optical pickup system for the following reasons: an optical disk, which is an object to be observed, has a high reflectance, the position of an objective lens is controlled to focus light on the optical disk continually, so that the confocal system is maintained; and the interference conditions change moment by moment due to up-and-down vibrations of the optical disk, causing interference noise easily. Moreover, optical systems including an optical fiber also cause the same interference noise as that in the confocal optical system. Thus, the optical waveguide device of the present invention is effective also in the optical systems using an optical fiber.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optical waveguide device comprising:

a substrate;

an optical waveguide formed in the vicinity of a surface of the substrate; and an optical thin film formed in at least a portion of the optical waveguide or formed in contact with at least a portion of the optical waveguide, wherein a plurality of guided waves with different wavelengths propagate in the optical waveguide, a portion of the guided waves that exits from the optical waveguide returns to the optical waveguide again, and the optical thin film prevents reflection of light returning to the optical waveguide from end faces of the optical waveguide or in the vicinity thereof, wherein fundamental light and harmonic light propagate in the optical waveguide, a harmonic light absorption region that comprises the optical thin film and absorbs the harmonic light is provided in the vicinity of an entrance end face of the optical waveguide, and the fundamental light propagates in the harmonic light absorption region and a harmonic light non-absorption region that does not absorb the harmonic light in the optical waveguide, and waveguide mode sizes of the fundamental light in the two regions substantially match.

2. The optical waveguide device according to claim 1, wherein an effective refractive index of the harmonic light absorption region substantially matches that of the harmonic light non-absorption region.

3. The optical waveguide device according to claim 1, wherein the fundamental light propagates in both the harmonic light absorption region and the harmonic light non-absorption region with a zero-order transverse mode.

4. The optical waveguide device according to claim 3, wherein a harmonic light absorption film that acts as the optical thin film is formed on the optical waveguide in the harmonic light absorption region.

5. The optical waveguide device according to claim 3, wherein the optical waveguide in the harmonic light non-absorption region comprises an optical waveguide layer and a high refractive index layer formed on the optical waveguide layer, wherein a refractive index of the high refractive index layer is larger than that of the optical waveguide layer, and the optical waveguide in the harmonic light absorption region comprises a second optical waveguide layer and a harmonic light absorption layer formed on the second optical waveguide layer, wherein the harmonic light absorption layer comprises a harmonic light absorption film as the optical thin film, and a refractive index of the harmonic light absorption film is larger than that of the second optical waveguide layer.

6. The optical waveguide device according to claim 3, wherein the optical waveguide in the harmonic light non-absorption region comprises an optical waveguide layer, and the optical waveguide in the harmonic light absorption region comprises a second optical waveguide layer and a harmonic light absorption layer formed on the second optical waveguide layer, wherein an upper portion of the second optical waveguide layer is removed so as to have a smaller thickness than that of the optical waveguide layer, the harmonic light absorption layer comprises a harmonic light absorption film as the optical thin film, and a refractive index of the harmonic light absorption film is larger than that of the second optical waveguide layer.

7. The optical waveguide device according to claim 3, wherein the optical waveguide in the harmonic light non-absorption region comprises an optical waveguide layer, and the optical waveguide in the harmonic light absorption region comprises a second optical waveguide layer and a harmonic light absorption layer formed on the second optical waveguide layer, wherein a substantial thickness of the second optical waveguide layer is smaller than that of the optical waveguide layer, the harmonic light absorption layer comprises a harmonic light absorption film as the optical thin film, and a refractive index of the harmonic light absorption film is larger than that of the second optical waveguide layer.

8. The optical waveguide device according to claim 3, wherein the optical thin film is formed by mixing and diffusing metal in the optical waveguide in the harmonic light absorption region.

9. The optical waveguide device according to claim 1, wherein the fundamental light propagates in the harmonic light non-absorption region with a zero-order transverse mode and in the harmonic light absorption region with a higher-order transverse mode of not less than first order.

10. The optical waveguide device according to claim 9, wherein the optical waveguide in the harmonic light absorption region comprises an optical waveguide layer and a harmonic light absorption layer formed on the optical waveguide layer, wherein the harmonic light absorption layer comprises a harmonic light absorption film as the optical thin film, and a refractive index of the harmonic light absorption film is larger than that of the optical waveguide layer.

11. The optical waveguide device according to claim 9, wherein
the optical waveguide in the harmonic light absorption region comprises an optical waveguide layer, a high refractive index layer formed on the optical waveguide layer, and a harmonic light absorption layer formed on the high refractive index layer, wherein a refractive index of the high refractive index layer is larger than that of the optical waveguide layer, the harmonic light absorption layer comprises a harmonic light absorption film as the optical thin film, and a refractive index of the harmonic light absorption film is larger than that of the high refractive index layer, and
the optical waveguide in the harmonic light non-absorption region comprises a second optical waveguide layer and a second high refractive index layer, wherein a refractive index of the second high refractive index layer is larger than that of the second optical waveguide layer.

12. The optical waveguide device according to claim 9, wherein
the optical waveguide in the harmonic light absorption region comprises an optical waveguide layer, a harmonic light absorption layer formed on the optical waveguide layer, and a high refractive index layer formed on the harmonic light absorption layer, wherein the harmonic light absorption layer comprises a harmonic light absorption film as the optical thin film, a refractive index of the harmonic light absorption film is larger than that of the optical waveguide layer, and a refractive index of the high refractive index layer is larger than that of the optical waveguide layer, and
the optical waveguide in the harmonic light non-absorption region comprises a second optical waveguide layer and a second high refractive index layer, wherein a refractive index of the second high refractive index layer is larger than that of the second optical waveguide layer.

13. The optical waveguide device according to claim 9, wherein the optical thin film is formed by mixing and diffusing metal in the optical waveguide in the harmonic light absorption region.

14. The optical waveguide device according to claim 1, wherein the waveguide mode size of the fundamental light propagating in the optical waveguide in the harmonic light absorption region changes continuously, and the waveguide mode sizes of the fundamental light at an entrance end and an exit end of the harmonic light absorption region substantially match the waveguide mode size of the fundamental light propagating in the optical waveguide in the harmonic light non-absorption region.

15. The optical waveguide device according to claim 14, wherein
the optical waveguide in the harmonic light absorption region comprises an optical waveguide layer and a harmonic light absorption layer formed on the optical waveguide layer, wherein the harmonic light absorption layer comprises a harmonic light absorption film as the optical thin film, and a substantial thickness of the harmonic light absorption film changes continuously in the harmonic light absorption region.

16. The optical waveguide device according to claim 1, wherein
fundamental light and harmonic light propagate in the optical waveguide, and
a harmonic light absorption film that absorbs the harmonic light and acts as the optical thin film is formed at an entrance end face of the optical waveguide.

17. The optical waveguide device according to claim 4, wherein the harmonic light absorption film is a semiconductor film or an oxide dielectric film.

18. The optical waveguide device according to claim 17, wherein the semiconductor film is one selected from the group consisting of a Si film, a ZnSe film and GaP film, and the oxide dielectric film is a $TiO_x$ film.

19. The optical waveguide device according to claim 18, wherein the $TiO_x$ film satisfies $1.7<x<1.9$.

20. The optical waveguide device according to claim 8, wherein the metal is iron.

21. The optical waveguide device according to claim 1, wherein a magnitude relationship between N1 and N2 differs depending on a wavelength of the guided wave, where N1 is a refractive index of the optical thin film and N2 is a refractive index of the optical waveguide.

22. The optical waveguide device according to claim 21, wherein the refractive indexes for at least one of the guided waves satisfy N1>N2, and the refractive indexes for the other guided wave satisfy N1<N2.

23. The optical waveguide device according to claim 22, wherein
fundamental light having a wavelength of $\lambda 1$ and harmonic light having a wavelength of $\lambda 2$ propagate in the optical waveguide, and
the wavelengths satisfy $\lambda 1 > \lambda 2$, the refractive indexes for the fundamental light having the wavelength $\lambda 1$ satisfy N1<N2, and the refractive indexes for the harmonic light having the wavelength $\lambda 2$ satisfy N1>N2.

24. The optical waveguide device according to claim 23, wherein the optical thin film has an absorption coefficient of not less than 0.001 for the harmonic light.

25. The optical waveguide device according to claim 23, wherein a harmonic light absorption film for absorbing the harmonic light is further provided on at least one selected from an upper face, a lower face, and an inside of the optical thin film.

26. The optical waveguide device according to claim 21, wherein the optical thin film is formed of a multi-layer film.

27. The optical waveguide device according to claim 21, wherein the optical thin film is formed on at least one selected from a surface, a lower face, and side faces of the optical waveguide.

28. The optical waveguide device according to claim 21, wherein the optical thin film is formed in a vicinity of an entrance portion of the optical waveguide.

29. The optical waveguide device according to claim 21, wherein normal lines to end portions of the optical thin film tilt with respect to a propagation direction of the guided wave at an angle greater than zero.

30. The optical waveguide device according to claim 21, wherein a clad layer having a refractive index N3 is further provided on a surface of the optical waveguide, and the refractive indexes of the clad layer and the optical waveguide satisfy N3>N2.

31. The optical waveguide device according to claim 21, wherein an antireflection film is provided on the entrance end face.

32. The optical waveguide device according to claim 31, wherein
fundamental light and harmonic light propagate in the optical waveguide, and
the antireflection film reduces a reflectance of the harmonic light to 1% or less.

33. A light source comprising:
a semiconductor laser and an optical waveguide device, wherein an optical waveguide device according to claim 1 is used as the optical waveguide device.

34. The light source according to claim 33, wherein the semiconductor laser is a wavelength-variable semiconductor laser that has a function of varying wavelength with high coherence.

35. An optical apparatus comprising:

a light source and a focusing optical system for focusing light emitted from the light source on an object to be observed, wherein a light source according to claim 33 is used as the light source, and the optical waveguide device of the light source and the object to be observed have a confocal relationship.

36. The optical apparatus according to claim 35, wherein the object to be observed is an optical disk.

37. The optical apparatus according to claim 35, further comprising an optical fiber, wherein light emitted from the light source enters the optical fiber.

38. The optical waveguide device according to claim 5, wherein the harmonic light absorption film is a semiconductor film or an oxide dielectric film.

39. The optical waveguide device according to claim 6, wherein the harmonic light absorption film is a semiconductor film or an oxide dielectric film.

40. The optical waveguide device according to claim 7, wherein the harmonic light absorption film is a semiconductor film or an oxide dielectric film.

41. The optical waveguide device according to claim 10, wherein the harmonic light absorption film is a semiconductor film or an oxide dielectric film.

42. The optical waveguide device according to claim 11, wherein the harmonic light absorption film is a semiconductor film or an oxide dielectric film.

43. The optical waveguide device according to claim 12, wherein the harmonic light absorption film is a semiconductor film or an oxide dielectric film.

44. The optical waveguide device according to claim 15, wherein the harmonic light absorption film is a semiconductor film or an oxide dielectric film.

45. The optical waveguide device according to claim 16, wherein the harmonic light absorption film is a semiconductor film or an oxide dielectric film.

46. The optical waveguide device according to claim 13, wherein the metal is iron.

* * * * *